United States Patent
Lee et al.

(10) Patent No.: US 10,741,676 B2
(45) Date of Patent: Aug. 11, 2020

(54) SEMICONDUCTOR DEVICE

(71) Applicant: SAMSUNG ELECTRONICS CO., LTD., Suwon-si, Gyeonggi-do (KR)

(72) Inventors: Dong-hun Lee, Anyang-si (KR); Dong-won Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/453,486

(22) Filed: Jun. 26, 2019

(65) Prior Publication Data

US 2019/0319137 A1 Oct. 17, 2019

Related U.S. Application Data

(63) Continuation of application No. 15/911,148, filed on Mar. 4, 2018, now Pat. No. 10,374,099, which is a (Continued)

(30) Foreign Application Priority Data

Dec. 3, 2015 (KR) .................. 10-2015-0171435

(51) Int. Cl.
*H01L 29/786* (2006.01)
*H01L 29/66* (2006.01)
(Continued)

(52) U.S. Cl.
CPC ...... *H01L 29/66795* (2013.01); *G11C 11/419* (2013.01); *H01L 21/02603* (2013.01);
(Continued)

(58) Field of Classification Search
CPC ......... H01L 21/02603; H01L 21/02606; H01L 21/823425; H01L 21/823431;
(Continued)

(56) References Cited

U.S. PATENT DOCUMENTS 6,864,519 B2  3/2005  Yeo et al.
8,158,472 B2  4/2012  Miyashita
(Continued)

FOREIGN PATENT DOCUMENTS

JP  2013-232674 A  11/2013

OTHER PUBLICATIONS

Wu, Yung-Chun, et al., "High-performance polycrystalline silicon thin-film transistor with multiple nanowire channels and lightly doped drain structure", Applied Physics Letters, vol. 84, No. 19, May 10, 2014. American Institute of Physics XP001220931, pp. 3822-3824.

*Primary Examiner* — Eduardo A Rodela
(74) *Attorney, Agent, or Firm* — Lee IP Law, PC

(57) ABSTRACT

A semiconductor device includes a first PMOS transistor, a first NMOS transistor, and a second NMOS transistor connected to an output node of the first PMOS and NMOS transistors. The first PMOS transistor includes first nanowires, first source and drain regions on opposite sides of each first nanowire, and a first gate completely surrounding each first nanowire. The first NMOS transistor includes second nanowires, second source and drain regions on opposite sides of each second nanowire, and a second gate extending from the first gate and completely surrounding each second nanowire. The second NMOS transistor includes third nanowires, third source and drain regions on opposite sides of each third nanowire, and a third gate, separated from the first and second gates, and completely surrounding each third nanowire. A number of third nanowires is greater than that of first nanowires. The first and second gates share respective first and second nanowires.

20 Claims, 38 Drawing Sheets

Related U.S. Application Data continuation of application No. 15/246,526, filed on Aug. 24, 2016, now Pat. No. 9,935,204.

(51) Int. Cl.
| | | |
|---|---|---|
| *H01L 27/11* | (2006.01) | |
| *H01L 29/06* | (2006.01) | |
| *H01L 29/423* | (2006.01) | |
| *G11C 11/419* | (2006.01) | |
| *H01L 27/146* | (2006.01) | |
| *H01L 21/02* | (2006.01) | |
| *H01L 29/10* | (2006.01) | |
| *H01L 29/78* | (2006.01) | |
| *H01L 27/11578* | (2017.01) | |

(52) U.S. Cl.
CPC .... *H01L 21/02606* (2013.01); *H01L 27/1104* (2013.01); *H01L 27/14616* (2013.01); *H01L 29/0665* (2013.01); *H01L 29/0669* (2013.01); *H01L 29/0673* (2013.01); *H01L 29/1025* (2013.01); *H01L 29/42392* (2013.01); *H01L 27/11578* (2013.01); *H01L 29/1037* (2013.01); *H01L 29/66787* (2013.01); *H01L 29/785* (2013.01)

(58) Field of Classification Search
CPC ..... H01L 21/823807; H01L 21/823814; H01L 21/823821; H01L 27/11578; H01L 27/14616; H01L 29/0665; H01L 29/0669; H01L 29/0673; H01L 29/1025; H01L 29/1037; H01L 29/42392; H01L 29/66439; H01L 29/66787; H01L 29/66795; H01L 29/785; H01L 29/78696; H01L 2924/13061; H01L 2924/13086; H01L 2924/15793

See application file for complete search history.

(56) References Cited

U.S. PATENT DOCUMENTS

| | | | |
|---|---|---|---|
| 8,174,881 B2 | 5/2012 | Kwon et al. | |
| 8,216,902 B2 | 7/2012 | Chang et al. | |
| 8,395,220 B2 | 3/2013 | Chang et al. | |
| 8,502,318 B2* | 8/2013 | Thomas | H01L 27/1104 |
| | | | 257/365 |
| 8,679,902 B1 | 3/2014 | Basker et al. | |
| 9,472,773 B1* | 10/2016 | Rosenblatt | H01L 51/0562 |
| 9,935,204 B2 | 4/2018 | Lee et al. | |
| 2006/0091481 A1 | 5/2006 | Li et al. | |
| 2008/0210981 A1 | 9/2008 | Chang et al. | |
| 2009/0189227 A1 | 7/2009 | Miyashita | |
| 2010/0314692 A1 | 12/2010 | Miyashita | |
| 2012/0168872 A1 | 7/2012 | Chang et al. | |
| 2014/0312427 A1 | 10/2014 | Maeda et al. | |
| 2015/0064891 A1 | 3/2015 | Cheng et al. | |
| 2015/0069328 A1 | 3/2015 | Leobandung | |
| 2015/0137262 A1 | 5/2015 | Baek et al. | |
| 2015/0370947 A1* | 12/2015 | Moroz | H01L 27/1203 |
| | | | 716/119 |
| 2016/0365440 A1* | 12/2016 | Suk | H01L 29/0673 |
| 2017/0103986 A1* | 4/2017 | Kim | H01L 27/0924 |
| 2017/0110542 A1* | 4/2017 | Lee | H01L 29/1033 |

\* cited by examiner

SEMICONDUCTOR DEVICE

CROSS-REFERENCE TO RELATED APPLICATIONS

This is a continuation application based on pending application Ser. No. 15/911,148, filed Mar. 4, 2018, which in turn is a continuation of application Ser. No. 15/246,526, filed Aug. 24, 2016, now U.S. Pat. No. 9,935,204 B2, issued Apr. 3, 2018, the entire contents of both being hereby incorporated by reference.

This application claims the benefit of Korean Patent Application No. 10-2015-0171435, filed on Dec. 3, 2015, in the Korean Intellectual Property Office, the disclosure of which is incorporated herein in its entirety by reference.

BACKGROUND

The inventive concept relates to a static random access memory (SRAM) device, and more particularly, to a SRAM device having improved electrical characteristics, and a logic device that includes the SRAM device.

An SRAM device exhibits lower power consumption and faster operating characteristics than a dynamic random access memory (DRAM) device, and has widely been applied to cache memory devices of computers or portable electronic products. Nevertheless, it is still necessary to improve electrical characteristics that are important to the operation of a SRAM device.

SUMMARY

The inventive concept provides a static random access memory (SRAM) device that has improved electrical characteristics.

The inventive concept also provides a logic device including the SRAM device.

According to an aspect of the inventive concept, there is provided a memory device including a circuit element including a first inverter including a first load transistor and a first drive transistor and a second inverter including a second load transistor and a second drive transistor, wherein input and output nodes of the first inverter and the second inverter are cross-connected to each other, a first transfer transistor connected to the output node of the first inverter, and a second transfer transistor connected to the output node of the second inverter.

Each of the first and second load transistors, the first and second drive transistors, and the first and second transfer transistors includes a transistor having multi-bridge channels. At least one of the first and second load transistors, the first and second drive transistors, and the first and second transfer transistors includes a transistor having a different number of multi-bridge channels from the other transistors.

According to another aspect of the inventive concept, there is provided a memory device including first to fourth multi-bridge channel structures arranged in a second direction and sequentially spaced apart from one another in a first direction that is substantially perpendicular to the second direction, a first gate structure arranged in the first direction, the first gate structure surrounding the first and second multi-bridge channel structures, first and second source and drain regions located in first and second multi-bridge channel structures on respective sides of the first gate structure, a second gate structure arranged in the first direction and spaced apart from the first gate structure in the second direction, the second gate structure surrounding the first multi-bridge channel structure, third source and drain regions located in the first multi-bridge channel structure on respective sides of the second gate structure, a third gate structure spaced apart from the first gate structure in the second direction and spaced apart from the second gate structure in the first direction, the third gate structure surrounding the third and fourth multi-bridge channel structures, fifth source and drain regions located in the third and fourth multi-bridge channel structures on respective sides of the third gate structure, a fourth gate structure spaced apart from the first gate structure in the first direction, the fourth gate structure surrounding the fourth multi-bridge channel structure, and sixth source and drain regions located in the fourth multi-bridge channel structure on respective sides of the fourth gate structure.

According to another aspect of the inventive concept, there is provided a memory device including an SRAM forming region including an SRAM device and a logic region configured to process data. The SRAM device includes a first inverter including a first load transistor and a first drive transistor, a second inverter including a second load transistor and a second drive transistor, a first transfer transistor connected to an output node of the first inverter, and a second transfer transistor connected to an output node of the second inverter. At least one of the first and second load transistors, the first and second drive transistors, and the first and second transfer transistors includes a transistor having a different number of multi-bridge channels from the other transistors.

According to another aspect of the inventive concept, a memory device comprises a latch circuit, a first transfer transistor and a second transfer transistor. The latch circuit comprises a first inverter and a second inverter. The first inverter comprises a first input node, a first load transistor, a first drive transistor and a first output node. The second inverter comprises a second input node, a second load transistor, a second drive transistor and a second output node. The first output node may be electrically connected to the second input node and the second output node may be electrically connected to the first input node. The first transfer transistor may be connected to the first output node. The second transfer transistor may be connected to the second output node. Each of the first and second load transistors, the first and second drive transistors, and the first and second transfer transistors may comprises a multi-bridge channel transistor, and at least one of the first and second load transistors, the first and second drive transistors, and the first and second transfer transistors may comprise a multi-bridge channel transistor having a number of multi-bridge channels that is different from a number of multi-bridge channels of the other transistors.

According to another aspect of the inventive concept, a memory device comprises a first to a fourth multi-bridge channel structures extending in a first direction and sequentially spaced apart from one another in a second direction that is substantially perpendicular to the first direction; a first gate structure extending in the second direction, the first gate structure surrounding the first and second multi-bridge channel structures; a first source region and a first drain region located in the first multi-bridge channel structure on respective sides of the first gate structure; a second source region and a second drain region located in the second multi-bridge channel structure on respective sides of the first gate structure; a second gate structure extending in the second direction and spaced apart from the first gate structure in the first direction, the second gate structure surrounding the first multi-bridge channel structure; a third source region and a third drain region located in the first multi-bridge channel structure on respective sides of the second gate structure; a third gate structure spaced apart from the first gate structure in the first direction and spaced apart from the second gate structure in the second direction, the third gate structure surrounding the third and fourth multi-bridge channel structures; a fourth source region and a fourth drain region located in the third multi-bridge channel structure on respective sides of the third gate structure; a fifth source region and a fifth drain region located in the fourth multi-bridge channel structure on respective sides of the third gate structure; a fourth gate structure spaced apart from the third gate structure in the second direction and spaced apart from the first gate structure in the second direction, the fourth gate structure surrounding the fourth multi-bridge channel structure; and a sixth source and a sixth drain region located in the fourth multi-bridge channel structure on respective sides of the fourth gate structure. Each of the first to fourth multi-bridge channel structures may comprise a plurality of nano-bridges as channels in which the plurality of nano-bridges may be stacked apart from one another in a third direction that is substantially perpendicular to a plane defined by the first direction and the second direction, and at least one of the first to fourth multi-bridge channel structures may comprise a number of nano-bridges that is different from a number of nano-bridges of the other multi-bridge channel structures.

According to still another aspect of the inventive concept, a memory device comprises a logic region and a static random access memory (SRAM) region that includes an SRAM device. The SRAM device may comprise a first inverter and a second inverter. The first inverter may comprise a first input node, a first load transistor, a first drive transistor and a first output node. The second inverter may comprise a second input node, a second load transistor, a second drive transistor and a second output node. The first output node may be electrically connected to the second input node and the second output node may be electrically connected to the first input node. At least one of the first and second load transistors, the first and second drive transistors, and the first and second transfer transistors may include a transistor having a number of multi-bridge channels that is different from a number of multi-bridge channels of the other transistors.

BRIEF DESCRIPTION OF THE DRAWINGS

Embodiments of the inventive concept will be more clearly understood from the following detailed description taken in conjunction with the accompanying drawings in which:

FIGS. 11A to 20A and 11B to 20B depict stages of a method of manufacturing transistors according to an embodiment;

DETAILED DESCRIPTION OF THE EMBODIMENTS

The inventive concept is disclosed by describing the following embodiments or combinations of embodiments. Accordingly, it should be understood that the inventive concept should not be construed as limited to embodiments or combinations of embodiments set forth herein.

Figure 1:
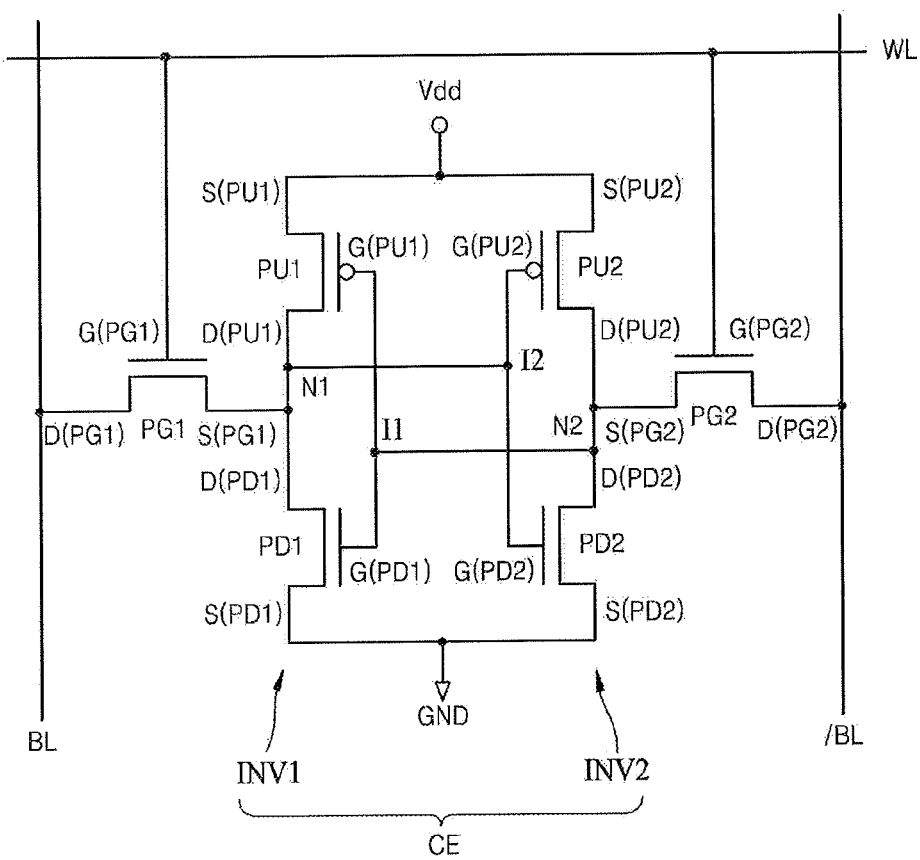
FIG. 1 is an equivalent circuit diagram of a static random access memory (SRAM) device according to an embodiment.

FIG. 1 is an equivalent circuit diagram of an SRAM device 10 according to an embodiment.

Specifically, FIG. 1 depicts an embodiment of one static random access memory (SRAM) cell of the SRAM device 10 for brevity. In one embodiment, the SRAM device 10 may include a plurality of SRAM cells arranged as an array.

The SRAM device 10 may include bit lines BL and/BL, a word line WL, and six transistors, for example, first and second transfer transistors PG1 and PG2, first and second load transistors PU1 and PU2, and first and second drive transistors PD1 and PD2. The first and second transfer transistors PG1 and PG2 may be referred to as pass transistors. The first and second load transistors PU1 and PU2 may be referred to as pull-up transistors. The first and second drive transistors PD1 and PD2 may be referred to as pull-down transistors.

The first and second load transistors PU1 and PU2 may include p-type metal oxide semiconductor (PMOS) transistors, and the first and second transfer transistors PG1 and PG2 and the first and second drive transistors PD1 and PD2 may include n-type MOS (NMOS) transistors.

Gates G(PG1) and G(PG2) of the first and second transfer transistors PG1 and PG2 may be electrically connected to the word line WL. Drain regions D(PG1) and D(PG2) of the first and second transfer transistors PG1 and PG2 may respectively be electrically connected to a pair of bit lines BL and/BL. Source regions S(PU1) and S(PU2) of the first and second load transistors PU1 and PU2 may be connected to a first power supply voltage Vdd, and source regions S(PD1) and S(PD2) of the first and second drive transistors PD1 and PD2 may be connected to a second power supply voltage GND. The first power supply voltage Vdd may be a power supply voltage, and the second power supply voltage GND may be a ground power supply voltage.

The first load transistor PU1 and the first drive transistor PD1 may form a first inverter INV1, and the second load transistor PU2 and the second drive transistor PD2 may form a second inverter INV2. A source region S(PG1) of the first transfer transistor PG1, a drain region D(PU1) of the first load transistor PU1 and a drain region D(PD1) of the first drive transistor PD1 may be electrically connected in common to a first node N1. The first transfer transistor PG1 may be connected to an output node (first node) N1 of the first inverter INV1.

A source region S(PG2) of the second transfer transistor PG2, a drain region D(PU2) of the second load transistor PU2 and a drain region D(PD2) of the second drive transistor PD2 may be electrically connected in common to a second node N2. The second transfer transistor PG1 may be connected to an output node (second node) N2 of the second inverter INV2.

A gate G(PU1) of the first load transistor PU1 and a gate G(PD1) of the first drive transistor PD1 may be electrically connected in common to a first input node I1 and to the second node N2, and form a first latch circuit. A gate G(PU2) of the second load transistor PU2 and a gate G(PD2) of the second drive transistor PD2 may be electrically connected in common to a second input node I2 and to the first node N1, and form a second latch circuit.

The input nodes I1 and I2 and the output nodes N1 and N2 of the first inverter INV1 and the second inverter INV2 may be cross-connected to one another. That is, the output node N1 of the first inverter INV1 may be connected to the input node I2 of the second inverter INV2. The output node N2 of the second inverter INV2 may be connected to the I1 of the first inverter INV2.

Thus, the SRAM device 10 may comprise a circuit element CE, which includes the first inverter INV1, the second inverter INV2, and an interconnection line configured to connect the input nodes I1 and I2 and the output nodes N1 and N2 of the first inverter INV1 and the second inverter INV2. The circuit element CE may be a flip-flop circuit or a latch circuit that serves as an information accumulator configured to store one bit of information.

A circuit operation the circuit CE will now be briefly described. If the first node N1 of the first inverter INV1 is at a high electric potential H, the second drive transistor PD2 is turned on and the second node N2 of the second inverter INV2 may be at a low electric potential L. Accordingly, the first drive transistor PD1 may be turned off so that a first node N1 may be maintained at the high electric potential H. That is, states of the first node N1 and the second node N2 may be maintained by the latch circuit that is configured by cross-coupling the first and second inverters INV1 and INV2, and information may be retained during the application of the first power supply voltage Vdd to the circuit element CE.

Additionally, if the word line WL is at a high electric potential H, the first and second transfer transistors PG1 and PG2 may be turned on, and the latch circuit may be electrically connected to the bit lines BL and/BL. Thus, an electric potential state, that may be either H or L, of each of the first and second nodes N1 and N2 may be transmitted or transferred to the bit lines BL and/BL and read as information contained in the SRAM cell of the SRAM device 10. To write information to the SRAM cell, information of the bit lines BL and/BL may be transmitted to the first and second nodes N1 and N2 by setting the word line WL to the high electric potential H and turning on the first and second transfer transistors PG1 and PG2. Accordingly, the SRAM device 10 may perform a read operation and a write operation.

In the SRAM device 10 according to the present embodiment, each of the first and second load transistors PU1 and PU2, the first and second drive transistors PD1 and PD2, and the first and second transfer transistors PG1 and PG2 may include a transistor having multi-bridge channels to improve electrical characteristics during the above-described circuit operation.

In a transistor having the multi-bridge channels, a plurality of channels may be vertically stacked apart from one another as described below.

Since a transistor having the multi-bridge channels is capable of reducing a short-channel effect, reducing a narrow-width effect, and reducing an area occupied by source and drain regions, the transistor having the multi-bridge channels may be advantageous to increasing integration density. Also, a uniform source/drain junction capacitance may be maintained irrespective of a position of a channel, so a high-speed highly reliable device may be manufactured.

In addition, in the SRAM device 10 according to the present embodiment, at least one of the first and second load transistors PU1 and PU2, the first and second drive transistors PD1 and PD2, and the first and second transfer transistors PG1 and PG2 may include a transistor having a number of multi-bridge channels that is different from the number of multi-bridge channels of the other transistors.

A transistor having a multi-bridge channel and transistors having different numbers of multi-bridge channels will be described in detail later.

Figure 2:
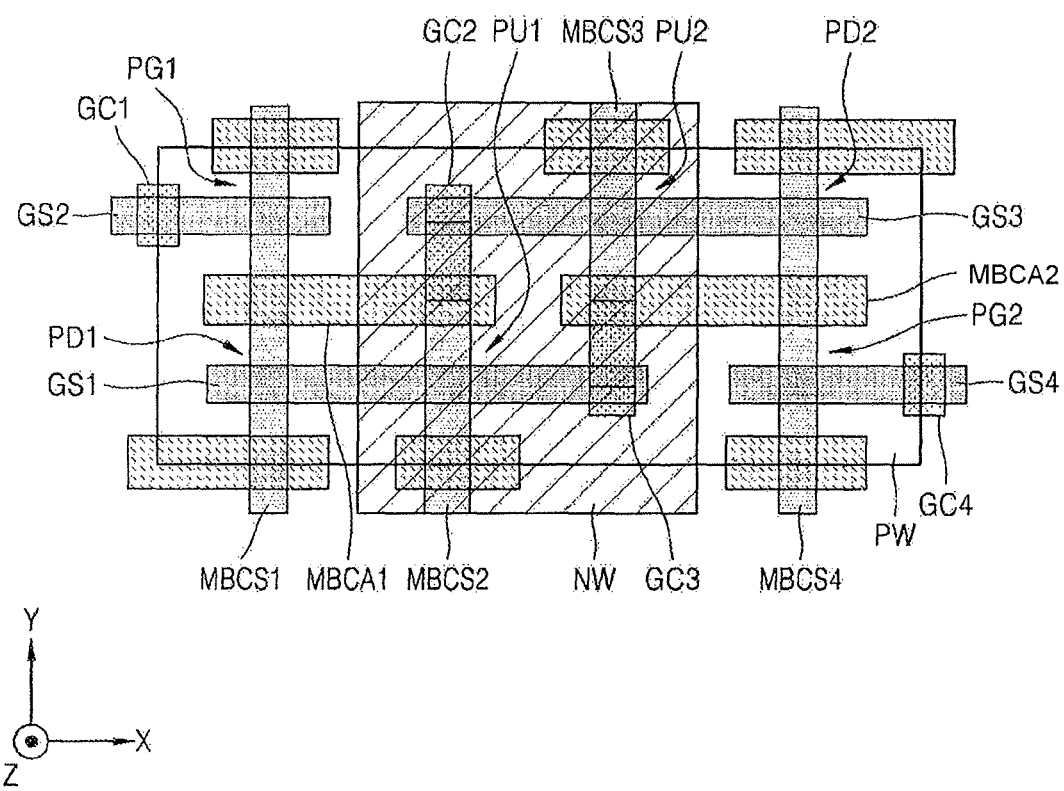
FIG. 2 depicts an embodiment of an example layout of an SRAM device that includes a transistor having multi-bridge channels of FIG. 1.
Figure 3:
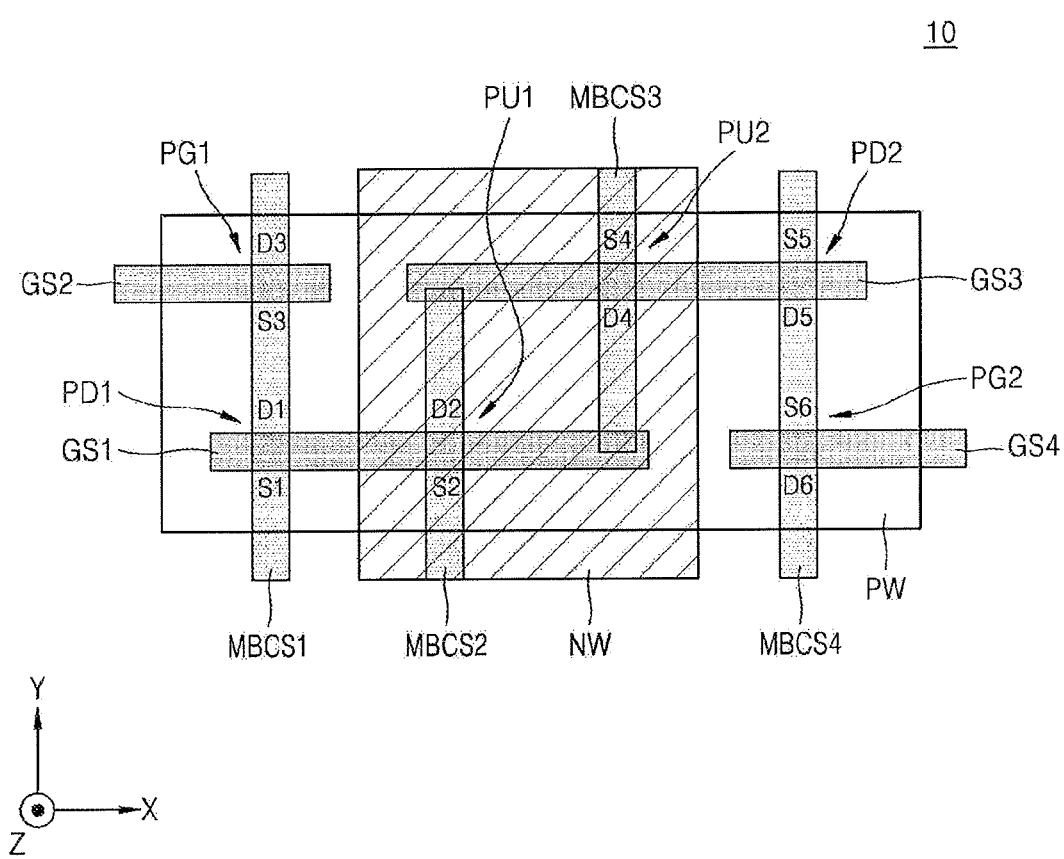
FIG. 3 depicts an embodiment of an example layout of an SRAM device that includes the multi-bridge channel structures and gate structures of FIG. 2.

FIG. 2 depicts an embodiment of an example layout of an SRAM device 10 that includes a transistor having multi-bridge channels of FIG. 1. FIG. 3 depicts an embodiment of an example layout of an SRAM device that includes the multi-bridge channel structures and gate structures of FIG. 2.

Specifically, the SRAM device 10 may include first to fourth multi-bridge channel structures MBCS1, MBCS2, MBCS3 and MBCS4, which may be arranged to extend in a second direction (e.g., the Y direction) and sequentially arranged apart from one another in a first direction (e.g., the X direction) that is substantially perpendicular to the second direction. The first to fourth multi-bridge channel structures MBCS1, MBCS2, MBCS3 and MBCS4 may be formed on an N-type well region NW and a P-type well region PW.

A first gate structure GS1 may be arranged to extend in the first direction on the first and second multi-bridge channel structures MBCS1 and MBCS2. As described below, the first gate structure GS1 may surround the first and second multi-bridge channel structures MBCS1 and MBCS2.

First source and drain regions S1 and D1 may be formed in the first multi-bridge channel structure MBCS1 on respective sides of the first gate structure GS1. The first source and drain regions S1 and D1 may be formed in the second direction (or Y direction) from each other in the multi-bridge channel structure MBCS1. The first gate structure GS1, the first multi-bridge channel structure MBCS1, and the first source and drain regions S1 and D1 may form a first drive transistor PD1. The first drive transistor PD1 may form an NMOS transistor.

Second source and drain regions S2 and D2 may be formed in the second multi-bridge channel structure MBCS2 on respective sides of the first gate structure GS1. The first source and drain regions S2 and D2 may be formed in the second direction (i.e., Y direction) from each other in the multi-bridge channel structure MBCS2. The first gate structure GS1, the second multi-bridge channel structure MBCS2, and the second source and drain regions S2 and D2 may form a first load transistor PU1. The first load transistor PU1 may form a PMOS transistor.

A second gate structure GS2 may be spaced apart from the first gate structure GS1 in the second direction and located on the first multi-bridge channel structure MBCS1 in the first direction. As described below, the second gate structure GS2 may surround the first multi-bridge channel structure MBCS1.

Third source and drain regions S3 and D3 may be formed in the first multi-bridge channel structure MBCS1 on respective sides of the second gate structure GS2. The third source and drain regions S3 and D3 may be formed in the second direction from each other. The second gate structure GS2, the first multi-bridge channel structure MBCS1, and the third source and drain regions S3 and D3 may form a first transfer transistor PG1. The first transfer transistor PG1 may form an NMOS transistor.

A third gate structure GS3 may be spaced apart from the first gate structure GS1 in the second direction, spaced apart from the second gate structure GS2 in the first direction, and may be located on the third and fourth multi-bridge channel structures MBCS3 and MBCS4. As described below, the third gate structure GS3 may surround the third and fourth multi-bridge channel structures MBCS3 and MBCS4.

Fourth source and drain regions S4 and D4 may be formed in the third multi-bridge channel structure MBCS3 on respective sides of the third gate structure GS3. The fourth source and drain regions S4 and D4 may be formed in the second direction from each other in the third multi-bridge channel structure MBCS3. The third gate structure GS3, the third multi-bridge channel structure MBCS3, and the fourth source and drain regions S4 and D4 may form a second load transistor PU2. The second load transistor PU2 may form a PMOS transistor.

Fifth source and drain regions S5 and D5 may be formed in the fourth multi-bridge channel structure MBCS4 on respective sides of the third gate structure GS3. The fifth source and drain regions S5 and D5 may be formed in the second direction from each other in the fourth multi-bridge channel structure MBSC4. The third gate structure GS3, the fourth multi-bridge channel structure MBCS4, and the fifth source and drain regions S5 and D5 may form a second drive transistor PD2. The second drive transistor PD2 may form an NMOS transistor.

A fourth gate structure GS4 may be spaced apart from the first gate structure GS1 in the first direction and may be located on the fourth multi-bridge channel MBCS4. As described below, the fourth gate structure GS4 may surround the fourth multi-bridge channel structure MBCS4.

Sixth source and drain regions S6 and D6 may be formed in the fourth multi-bridge channel structure MBCS4 on respective sides of the fourth gate structure GS4. The sixth source and drain regions S6 and D6 may be formed in the second direction from each other in the fourth multi-bridge channel structure MBCS4. The fourth gate structure GS4, the fourth multi-bridge channel structure MBCS4, and the sixth source and drain regions S6 and D6 may form a second transfer transistor PG2. The second transfer transistor PG2 may form an NMOS transistor.

The first multi-bridge channel structure MBCS1 may be electrically connected to the second multi-bridge channel structure MBCS2 via a first multi-bridge contact MBCA1. That is, the first multi-bridge contact MBCA1 may be a contact that may be electrically connected to the first multi-bridge channel structure MBCS1 and the second multi-bridge channel structure MBCS2. The first multi-bridge contact MBCA1 may be electrically connected to the third gate structure GS3 via a gate contact GC2.

The third multi-bridge channel structure MBCS3 may be electrically connected to the fourth multi-bridge channel structure MBCS4 via a second multi-bridge contact MBCA2. That is, the second multi-bridge contact MBCA2 may be a contact that may be electrically connected to the third multi-bridge channel structure MBCS3 and the fourth multi-bridge channel structure MBCS4. The second multi-bridge contact MBCA2 may be electrically connected to the first gate structure GS1 via a gate contact GC3. The second gate structure GS2 and the fourth gate structure GS4 may be respectively connected to a word line W/L via gate contacts GC1 and GC4.

The first to fourth multi-bridge channel structures MBCS1, MBCS2, MBCS3 and MBCS4, which are respectively surrounded by the first to fourth gate structures GS1, GS2, GS3 and GS4, may include a plurality of nano-bridges that may function as channels and may be stacked apart from one another in a third direction (e.g., the Z direction) that is substantially perpendicular to a plane defined by the first direction and the second direction to thereby improve electrical characteristics.

In other words, as described above, the first and second load transistors PU1 and PU2, the first and second drive transistors PD1 and PD2, and the first and second transfer transistors PG1 and PG2, which are embodied in the first to fourth multi-bridge channel structures MBCS1, MBCS2, MBCS3 and MBCS4, may include nano-bridges that serve as the channels to provide improved electrical characteristics.

Furthermore, at least one of the first to fourth multi-bridge channel structures MBCS1, MBCS2, MBCS3 and MBCS4, which are respectively surrounded by the first to fourth gate structures GS1, GS2, GS3 and GS4, may include a number of nano-bridges that is different from the number of nano-bridges of the other multi-bride channel structures.

As described above, the number of stacked nano-bridges of at least one of the first and second load transistors PU1 and PU2, the first and second drive transistors PD1 and PD2, and the first and second transfer transistors PG1 and PG2, which are embodied in the first to fourth multi-bridge channel structures MBCS1, MBCS2, MBCS3 and MBCS4, may be different from the number of stacked nano-bridges of the other transistors.

Hereinafter, transistors having multi-bridge channels, which may form first and second load transistors PU1 and PU2, first and second drive transistors PD1 and PD2, and first and second transfer transistors PG1 and PG2, will be described. Also, multi-bridge channels, which are embodied in the first to fourth multi-bridge channel structures MBCS1, MBCS2, MBCS3 and MBCS4, and nano-bridges included in the multi-bridge channels will be described.

Figure 4:
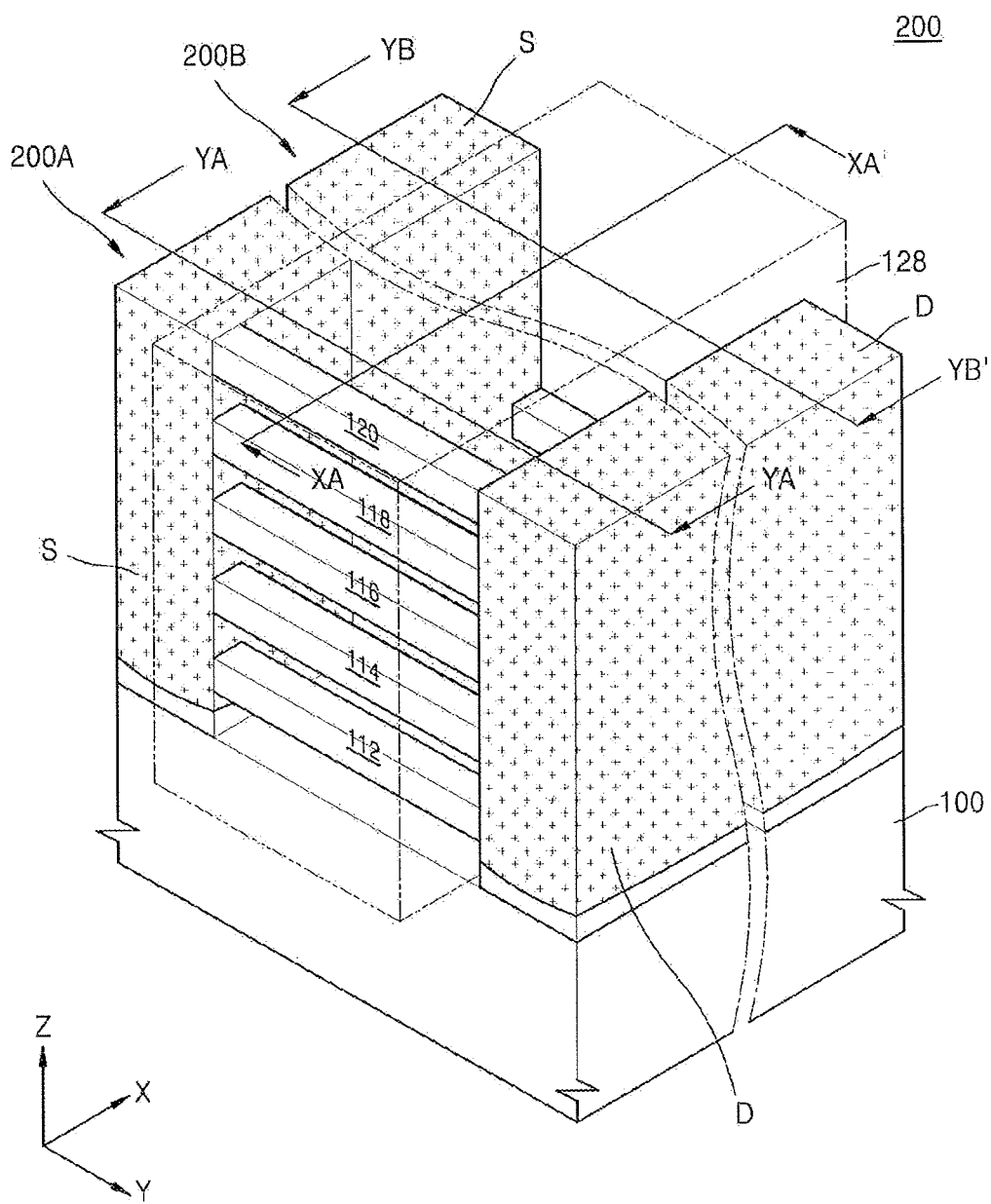
FIG. 4 depicts a perspective view of transistors having multi-bridge channels used for an SRAM device according to an embodiment.
Figure 5:
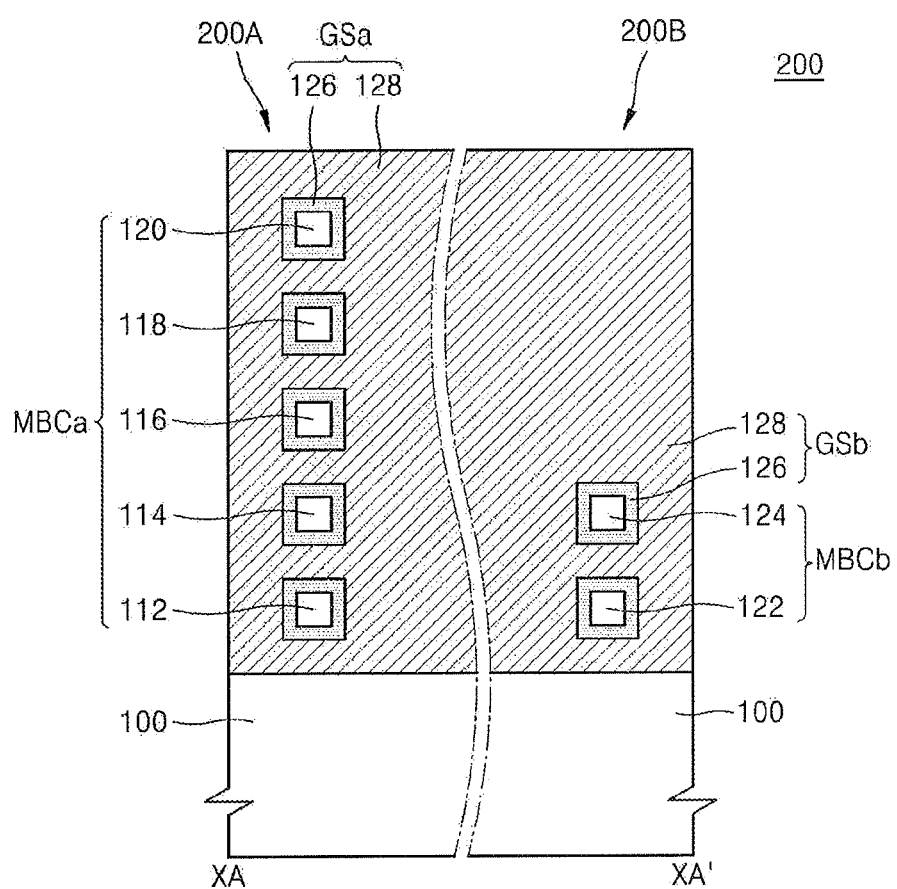
FIG. 5 depicts a cross-sectional view taken long a line XA-XA' of FIG. 4.

FIG. 4 depicts a perspective view of transistors 200 having multi-bridge channels used for an SRAM device according to an embodiment. FIG. 5 depicts a cross-sectional view taken along a line XA-XA' of FIG. 4, and FIG. 6 depicts a cross-sectional view taken along lines YA-YA' and YB-YB' of FIG. 4.

Figure 6:
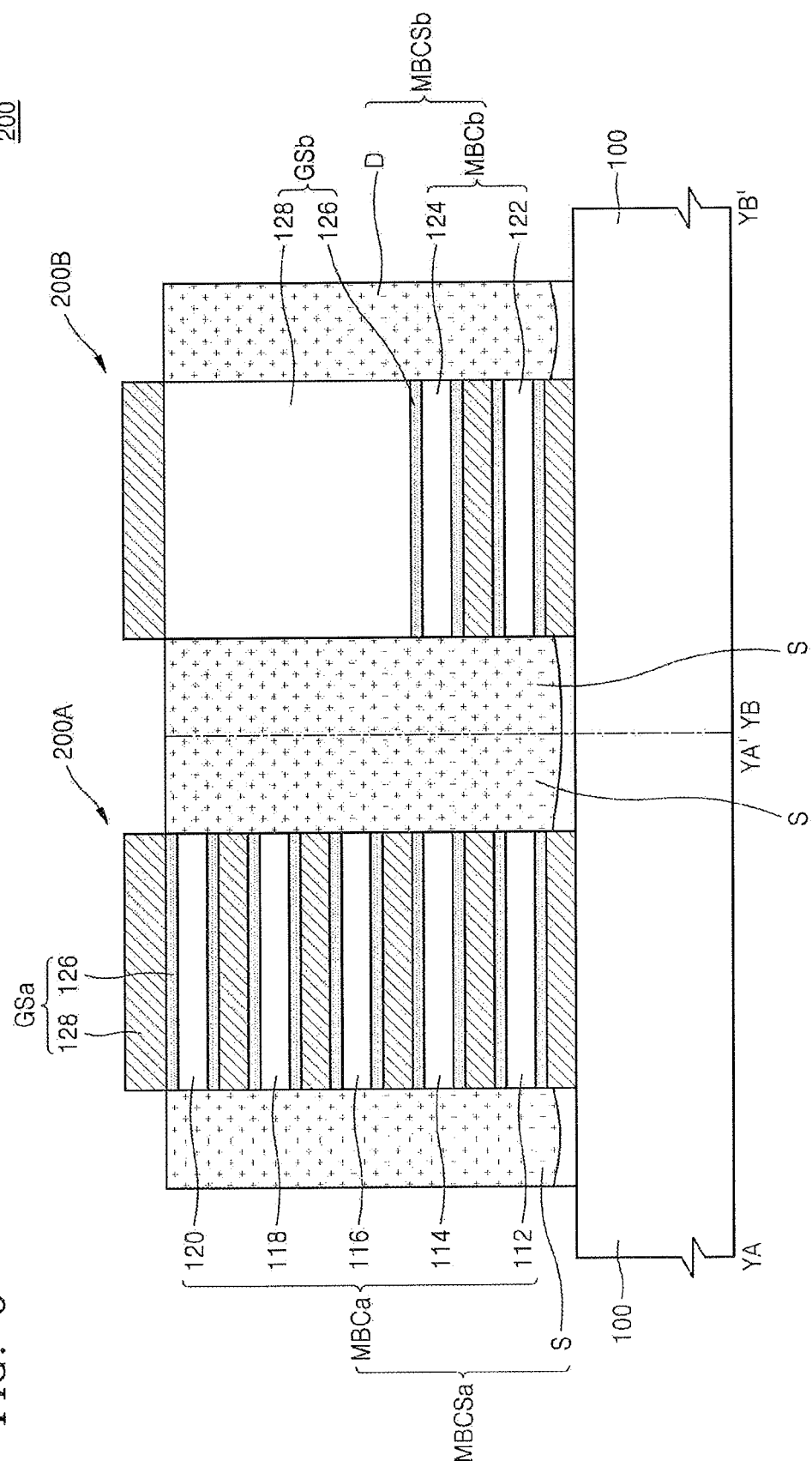
FIG. 6 depicts a cross-sectional view taken along lines YA-YA' and YB-YB' of FIG. 4.

Specifically, the transistors 200 of FIGS. 4 to 6 may include a first transistor 200A and a second transistor 200B. The transistors 200 may be MOS transistors. FIG. 5 depicts a cross-sectional view of the transistors 200, which is taken along the X direction of the multi-bridge channel structures MBCS1, MBCS2, MBCS3 and MBCS4 that are surrounded by the gate structures GS1, GS2, GS3 and GS4 of FIG. 3.

FIG. 6 depicts a cross-sectional view of the transistors 200, which is taken along the Y direction of the multi-bridge channel structures MBCS1, MBCS2, MBCS3 and MBCS4 that are surrounded by the gate structures GS1, GS2, GS3 and GS4 of FIG. 3. In FIGS. 4 to 6, only two transistors 200 are illustrated for brevity.

The transistors 200 may include multi-bridge channel structures MBCSa and MBCSb and gate structures GSa and GSb, which are formed on a semiconductor substrate 100. The multi-bridge channel structures MBCSa and MBCSb may respectively include multi-bridge channels MBCa and MBCb, and source and drain regions S and D.

The gate structures GSa and GSb may surround the multi-bridge channels MBCa and MBCb. The gate structures GSa and GSb may surround the multi-bridge channels MBCa and MBCb, but not the source and drain regions S and D. Each of the gate structures GSa and GSb may include a gate insulating layer 126 and a gate electrode 128.

The multi-bridge channels MBCa and MBCb of the transistors 200 may include nano-bridges 112, 114, 116, 118, 120, 122 and 124, which are stacked on a semiconductor substrate 100 and spaced apart from one another. The nano-bridges 112, 114, 116, 118, 120, 122 and 124 may be a channels serving as charge paths between the source region S and the drain region D.

For example, since the multi-bridge channels MBCa of the first transistor 200A include five nano-bridges 112, 114, 116, 118 and 120 that are stacked, the first transistor 200A may have five multi-bridge channels MBCa. Although the first transistor 200A is depicted as having five multi-bridge channels MBCa, the first transistor 200a may include fewer multi-bridge channels, such as four multi-bridge channels. In another embodiment, the first transistor 200A may include more than five multi-bridge channels.

Since each of the multi-bridge channels MBCb of the second transistor 200B includes two nano-bridges 122 and 124 that are stacked, the second transistor 200B may include two multi-bridge channels MBCb. Although the second transistor 200B is depicted as having two multi-bridge channels MBCb, the second transistor 200b may include fewer multi-bridge channels, such as one multi-bridge channel. In another embodiment, the second transistor 200B may have more than two multi-bridge channels.

Each of the nano-bridges 112, 114, 116, 118, 120, 122 and 124 and the gate insulating layer 126 included in each of the gate stack structures GSa and GSb may have a substantially quadrangular sectional shape. When the nano-bridges 112, 114, 116, 118, 120, 122 and 124 have substantially quadrangular sectional shapes, the nano-bridges 112, 114, 116, 118, 120, 122 and 124 may be referred to as nano-sheets.

The transistors 200 may be used as the first and second load transistors PU1 and PU2, the first and second drive transistors PD1 and PD2, and/or the first and second transfer transistors PG1 and PG2 of the SRAM device 10 of FIGS. 1 to 3. In other words, if the transistors 200 are used in the SRAM device 10 of FIGS. 1 to 3, at least one of the first and second load transistors PU1 and PU2, the first and second drive transistors PD1 and PD2, and the first and second transfer transistors PG1 and PG2 may include transistors having a number of multi-bridge channels (e.g., MBCa and MBCb) that is different from the number of multi-bridge channels of the other transistors.

In an embodiment, the first transistor 200A may be used as the first and second drive transistors PD1 and PD2 and the first and second transfer transistors PG1 and PG2 of the SRAM device 10 of FIGS. 1 to 3. In other words, the first and second drive transistors PD1 and PD2 may include the same number of multi-bridge channels MBCa as the first and second transfer transistors PG1 and PG2.

The second transistor 200B may be used as the first and second load transistors PU1 and PU2 of the SRAM device 10 of FIGS. 1 to 3. In other words, the number of multi-bridge channels MBCb of the first and second load transistors PU1 and PU2 may be less than the number of multi-bridge channels MBCa of the first and second drive transistors PD1 and PD2 and the first and second transfer transistors PG1 and PG2.

For example, the number of multi-bridge channels MBCb of the first and second load transistors PU1 and PU2 may be about 70% or less than the number of multi-bridge channels MBCa of the first and second drive transistors PD1 and PD2 and the first and second transfer transistors PG1 and PG2.

When the number of multi-bridge channels MBCa of the first and second load transistors PU1 and PU2 is less than the number of multi-bridge channels MBCb of the first and second drive transistors PD1 and PD2 and the first and second transfer transistors PG1 and PG2, write-operation characteristics of the SRAM device may be improved.

More specifically, a write operation may include writing a high electric potential H to nodes (a first node or a second node) that are connected to the first and second load transistors PU1 and PU2 and transferring charges into the first and second transfer transistors PG1 and PG2. In this case, when a large quantity of charge flows into the nodes (the first node or the second node) that are connected to the first and second load transistors PU1 and PU2, a transition to a low electric potential L may be retarded and potentially enabling a write failure.

Thus, if the quantity of charge transferred into the first and second transistors PG1 and PG2 is reduced by reducing the number of multi-bridge channels of the first and second load transistors PU1 and PU2 to be less than the number of multi-bridge channels of the first and second drive transistors PD1 and PD2 or the first and second transfer transistors PG1 and PG2, write-operation characteristics of the SRAM device may be improved.

Figure 7A:
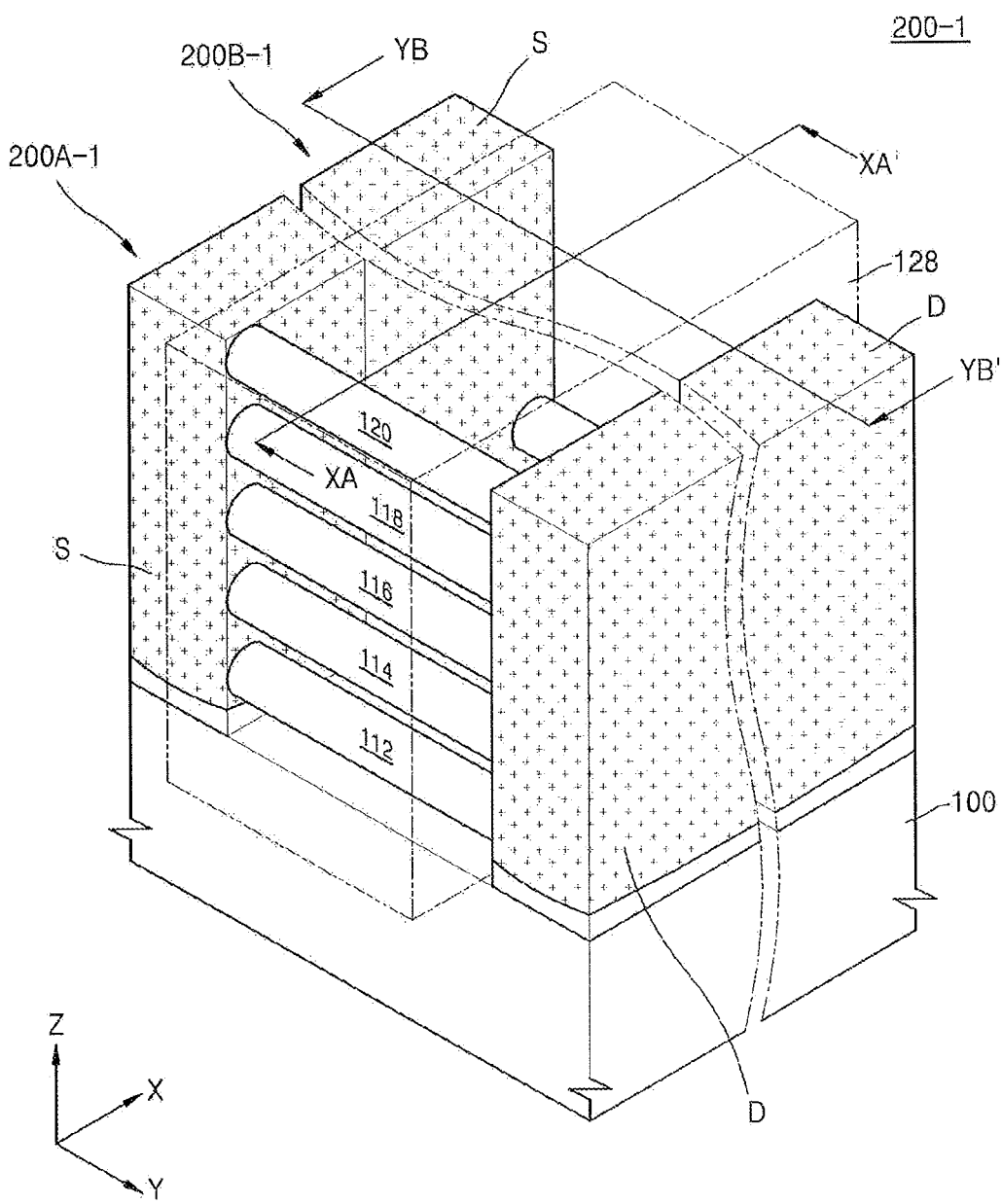
FIGS. 7A and 7B depict cross-sectional views of transistors having multi-bridge channels used for an SRAM device according to an embodiment.
Figure 7B:
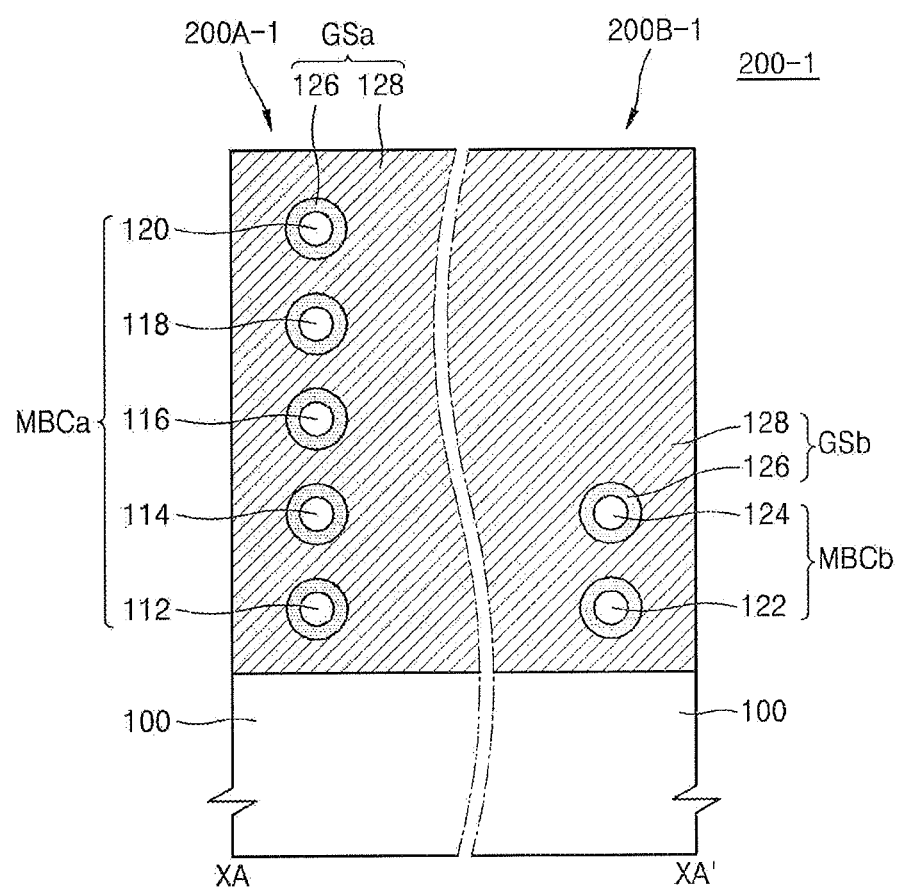

FIGS. 7A and 7B depict cross-sectional views of transistors 200-1 having multi-bridge channels that is used for an SRAM device according to an embodiment.

Specifically, FIGS. 7A and 7B respectively depict cross-sectional views corresponding to FIGS. 4 and 5. FIG. 7B depicts a cross-sectional view taken along a line XA-XA' of FIG. 7A. The transistors 200-1 may be the same as the transistors 200 of FIGS. 4 and 5 except for sectional shapes of nano-bridges 112, 114, 116, 118, 120, 122 and 124 that are included in multi-bridge channels MBCa and MBCb, and a gate insulating layer 126 that is included in each of gate stack structures GSa and GSb.

In FIGS. 7A and 7B, the same reference numerals are used to denote the same elements as in FIGS. 4 and 5, and repeated descriptions thereof will be omitted or simplified for brevity. The transistors 200-1 may include a first transistor 200A-1 and a second transistor 200B-1. Unlike the transistors 200 of FIGS. 4 and 5, in the transistors 200-1 of FIGS. 7A and 7B, the nano-bridges 112, 114, 116, 118, 120, 122 and 124 that are included in the multi-bridge channels MBCa and MBCb, and the gate insulating layer 126 that is included in each of gate stack structures GSa and GSb may have substantially circular sectional shapes.

When the nano-bridges 112, 114, 116, 118, 120, 122 and 124 have substantially circular sectional shapes, the nano-bridges 112, 114, 116, 118, 120, 122 and 124 may be referred to as nano-wires.

Figure 8:
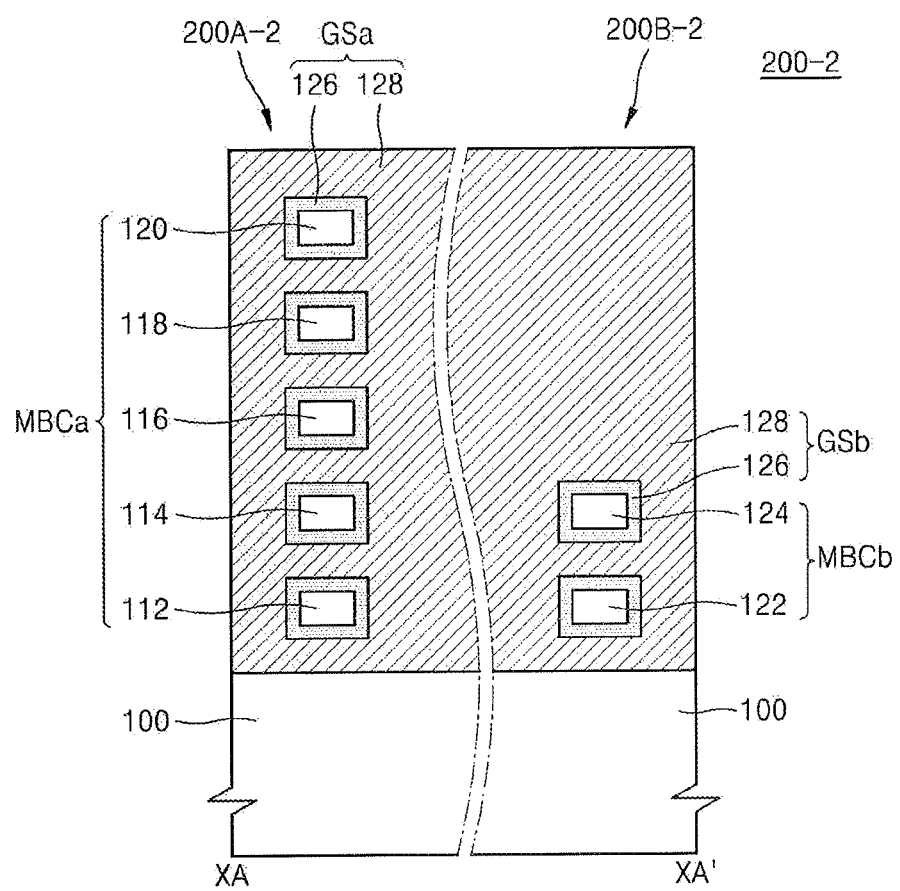
FIG. 8 depicts a cross-sectional view of transistors having multi-bridge channels used for an SRAM device according to an embodiment.

FIG. 8 depicts a cross-sectional view of transistors 200-2 having multi-bridge channels that is used for an SRAM device according to an embodiment.

Specifically, FIG. 8 depicts a cross-sectional view corresponding to FIG. 5. FIG. 7B is a cross-sectional view taken along a line XA-XA' of FIG. 7A. The transistors 200-2 may be the same as the transistors 200 of FIG. 5 except for sectional shapes of nano-bridges 112, 114, 116, 118, 120, 122 and 124 that are included in multi-bridge channels MBCa and MBCb, and the gate insulating layer 126 that is included in each of gate stack structures GSa and GSb. In FIG. 8, the same reference numerals are used to denote the same elements as in FIGS. 4 to 6, and repeated descriptions thereof will be omitted or simplified for brevity.

The transistors 200-2 may include a first transistor 200A-2 and a second transistor 200B-2. Unlike the transistors 200 of FIG. 5, in the transistors 200-2, the nano-bridges 112, 114, 116, 118, 120, 122 and 124 included in multi-bridge channels MBCa and MBCb, and the gate insulating layer 126 included in each of the gate stack structures GSa and GSb may have substantially rectangular sectional shapes.

When the nano-bridges 112, 114, 116, 118, 120, 122 and 124 have substantially rectangular sectional shapes, the nano-bridges 112, 114, 116, 118, 120, 122 and 124 may be referred to as nano-sheets.

Figure 9:
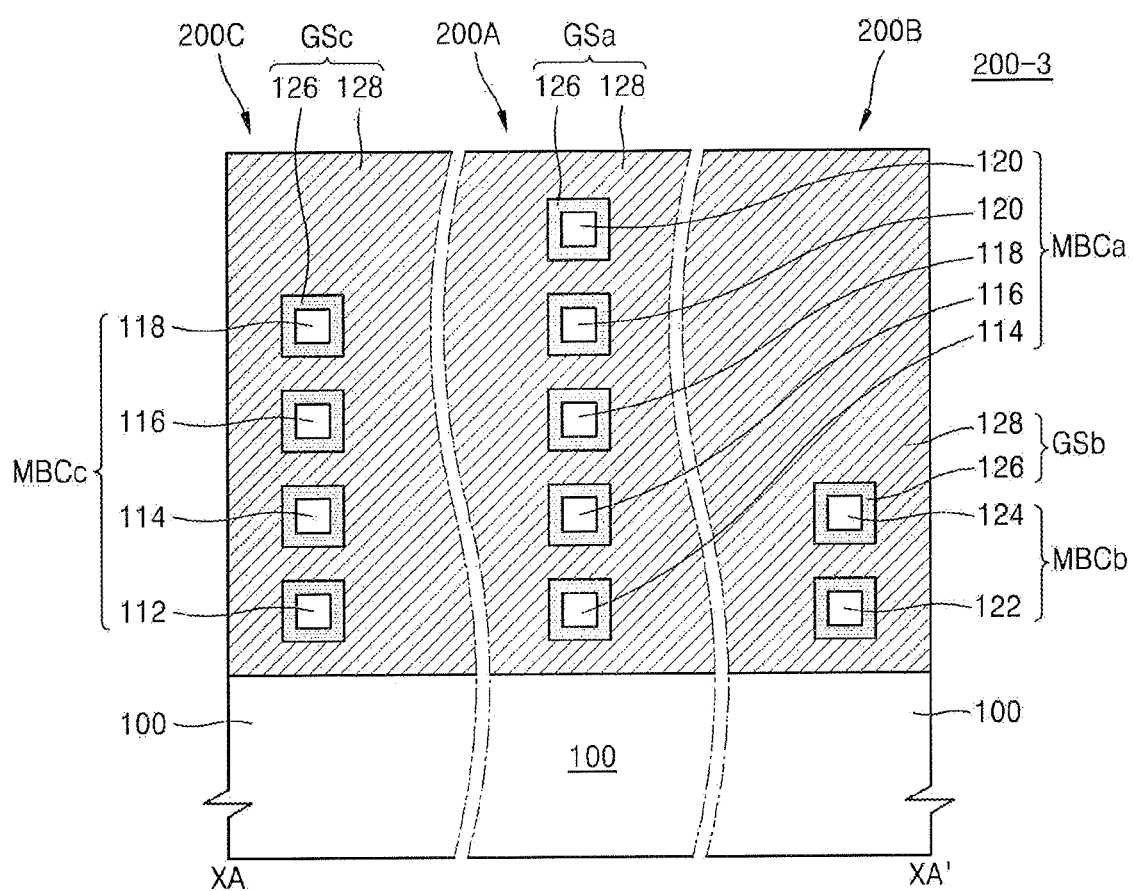
FIGS. 9 and 10 depict cross-sectional views of transistors having multi-bridge channels used for an SRAM device according to an embodiment.
Figure 10:
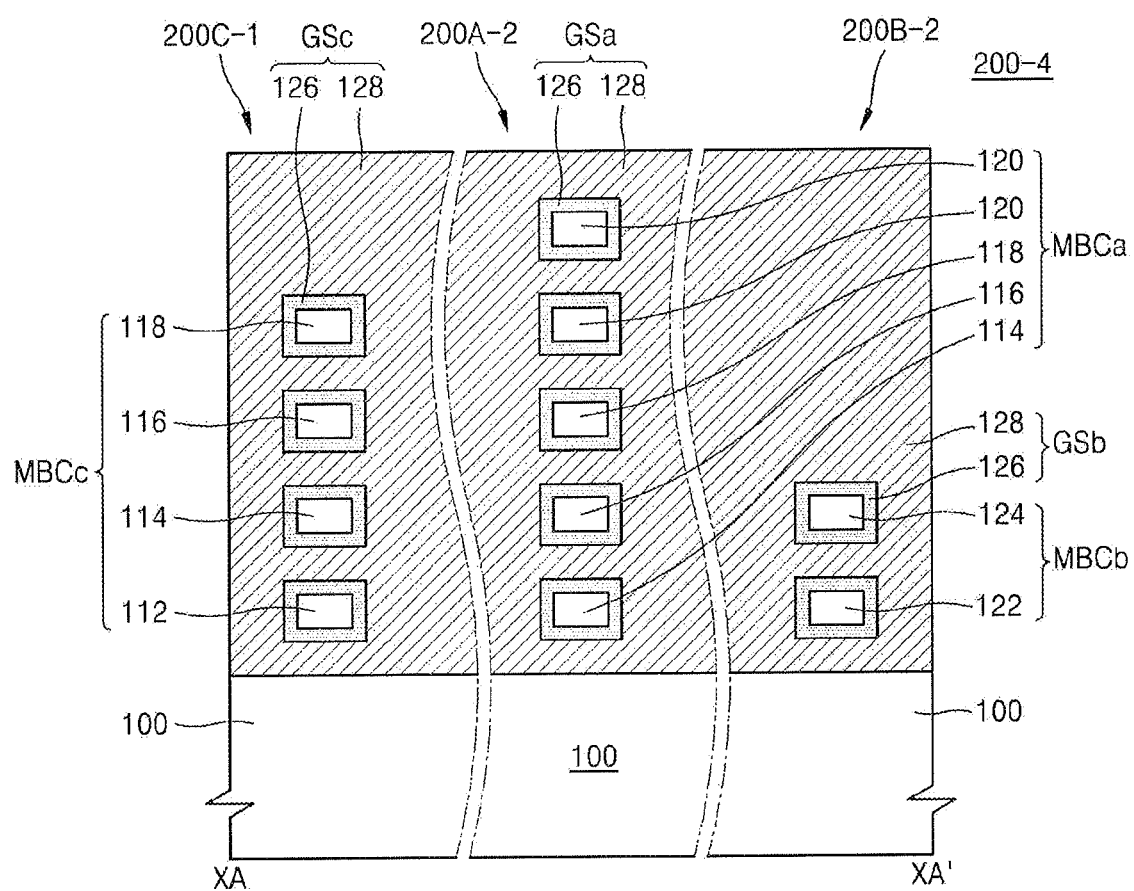

FIGS. 9 and 10 depict cross-sectional views of transistors 200-3 and 200-4 having multi-bridge channels that are used for an SRAM device according to an embodiment.

Specifically, FIGS. 9 and 10 depict cross-sectional views corresponding to FIGS. 5 and 8. The transistors 200-3 and 200-4 may be the same as the transistors 200 and 200-2 of FIGS. 5 and 8 except that the transistors 200-3 and 200-4 include third transistors 200C and 200C-1. In FIGS. 9 and 10, the same reference numerals are used to denote the same elements as in FIGS. 4 to 8, and repeated descriptions thereof will be omitted or simplified for brevity.

The transistors 200-3 and 200-4 may include nano-bridges 112, 114, 116, 118, 120, 122 and 124 that are included in multi-bridge channels MBCa, MBCb, and MBCc and gate stack structures GSa, GSb and GSc. The transistors 200-3 and 200-4 may include first transistors 200A and 200A-2, second transistors 200B and 200B-2 and third transistors 200C and 200C-1.

The first transistors 200A and 200A-2 may include five nano-bridges 112, 114, 116, 118 and 120, and the first transistors 200A and 200A-2 may include five multi-bridge channels MBCa. The second transistors 200B and 200B-2 may include two nano-bridges 112 and 114, and the second transistors 200B and 200B-2 may include two multi-bridge channels MBCb.

The third transistors 200C and 200C-1 include fourth nano-bridges 112, 114, 116 and 118, and the third transistors 200C and 200C-1 may include four multi-bridge channels MBCc. Although the third transistors 200C and 200C-1 are depicted as including fourth multi-bridge channels MBCc, the third transistors 200C and 200-C may include a fewer number of multi-bridge channels (e.g., three multi-bridge channels) than the number of multi-bridge channels included in the first transistors 200A and 200A-2.

The transistors 200-3 and 200-4 may be used as the first and second load transistors PU1 and PU2, the first and second drive transistors PD1 and PD2, and/or the first and second transfer transistors PG1 and PG2 of the SRAM device 10 of FIGS. 1 to 3.

In other words, if the transistors 200-3 and 200-4 are used in the SRAM device 10 of FIGS. 1 to 3, at least one of the first and second load transistors PU1 and PU2, the first and second drive transistors PD1 and PD2 and the first and second transfer transistors PG1 and PG2 may include a transistor having a number of multi-bridge channels MBCa, MBCb, and MBCc that is different from the number of multi-bridge channels of the other transistors.

In an embodiment, the first transistor 200A-1 may be used as the first and second drive transistors PD1 and PD2 of the SRAM device 10 of FIGS. 1 to 3. The second transistor 200B-1 may be used as the first and second load transistors PU1 and PU2 of the SRAM device 200 of FIGS. 1 to 3. The third transistors 200C and 200C-1 may be used as the first and second transfer transistors PG1 and PG2 of the SRAM device 10 of FIGS. 1 to 3.

In other words, the number of multi-bridge channels MBCc of the first and second transfer transistors PG1 and PG2 may be less than the number of multi-bridge channels MBCa of the first and second drive transistors PD1 and PD2. If the number of the multi-bridge channels MBCc of the first and second transfer transistors PG1 and PG2 is less than the number of multi-bridge channels MBCa of the first and second drive transistors PD1 and PD2, the SRAM device may be prevented from exhibiting disturbance failures, and, therefore, may operate at a low operating voltage.

More specifically, if a current is supplied to the first and second transfer transistors PG1 and PG2 that is less than a current supplied to the first and second drive transistors PD1 and PD2 by reducing the number of the multi-bridge channels MBCc of the first and second transfer transistors PG1 and PG2, a node voltage between the first and second transfer transistors PG1 and PG2, and the first and second drive transistors PD1 and PD2 may be maintained low. In this case, a disturbance failure of the SRAM device may be minimized in which "disturbance failure" refers to a situation in which the opposite latch circuit is turned on due to a rise in node voltage caused by noise.

If the number of multi-bridge channels MBCc of the first and second transfer transistors PG1 and PG2 is less than the number of multi-bridge channels MBCa of the first and second drive transistors PD1 and PD2, the currents of the first and second transfer transistors PG1 and PG2 of the SRAM device may be effectively reduced. Thus, disturbance characteristics of the SRAM device may be improved, and the SRAM device may operate even at a relatively low operating voltage.

FIGS. 11A to 20A and 11B to 20B depict diagrams of stages of a method of manufacturing transistors according to an embodiment. FIG. 21 is a flow diagram 2100 of a method of manufacturing transistors according to an embodiment.

Specifically, FIGS. 11A to 20A and 11B to 20B will be presented to describe the method of manufacturing transistors 200 and 200-1. Although the transistors 200 and 200-1 may be manufactured in various ways, FIGS. 11A to 20A and 11B to 20B depict stages of a method of manufacturing the transistors 200 and 200-1 according to one embodiment.

FIGS. 11A to 20A depict perspective views of stages of a method of manufacturing transistors according to an embodiment. FIGS. 11B to 20B respectively depict cross-sectional views taken along lines XA-XA' of FIGS. 11A to 20A.

Figure 11A:
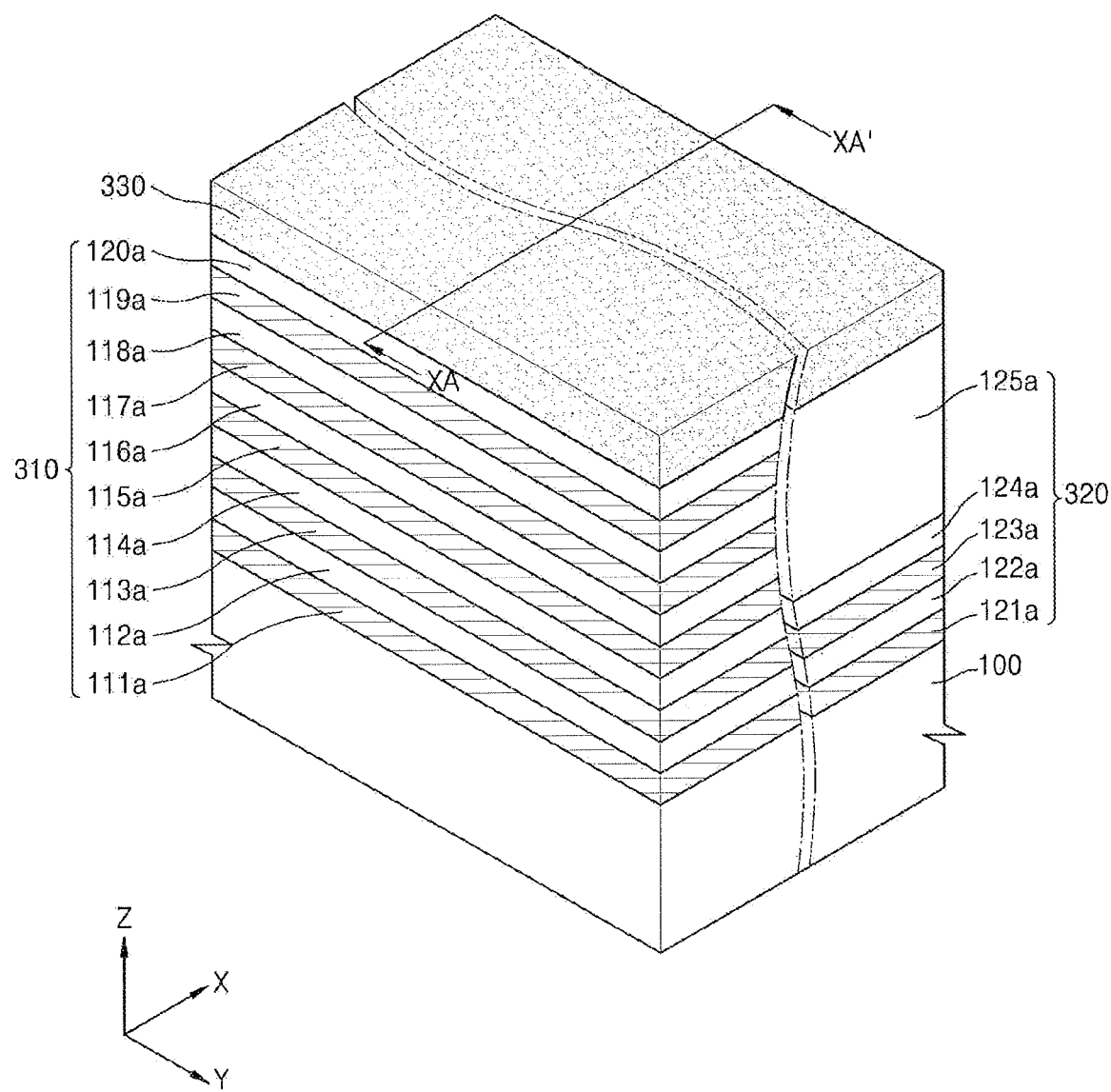
Figure 11B:
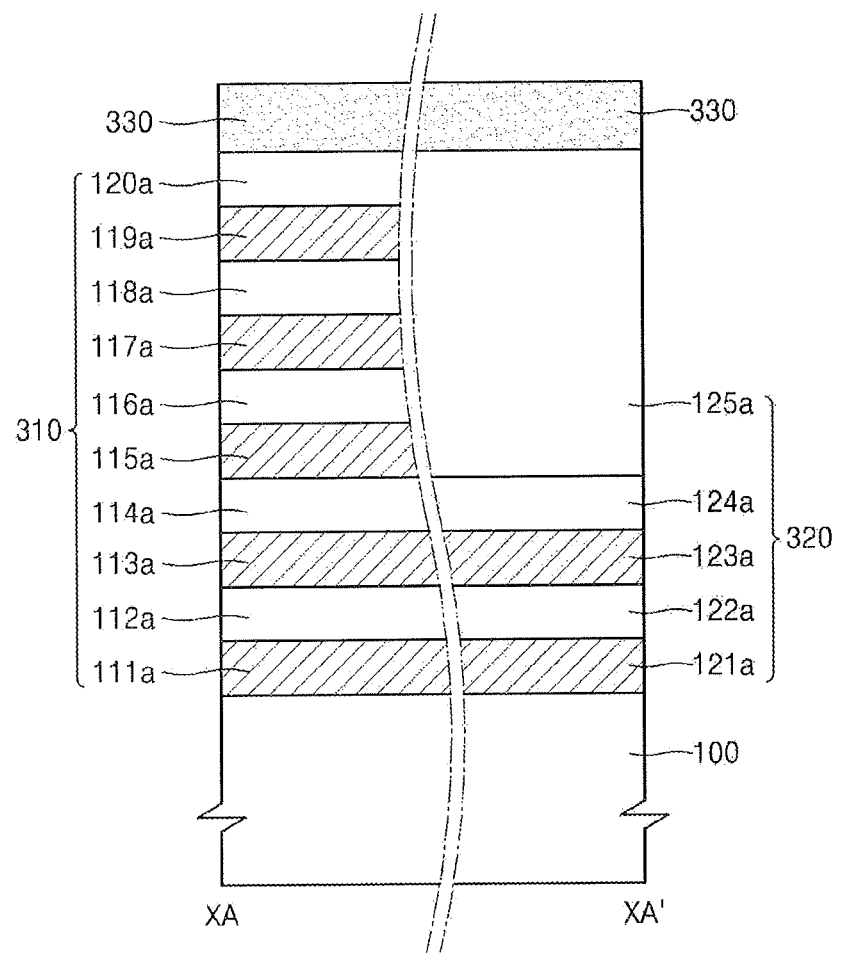

Referring to FIGS. 11A and 11B, a semiconductor substrate 100 may be prepared. The semiconductor substrate 100 may be a bulk silicon substrate or a silicon-on-insulator (SOI) substrate. Also, one or more device isolation regions (not shown) may be formed in the semiconductor substrate 100. A device isolation region may be formed by using an ordinary process, such as a shallow trench isolation (STI) process.

Subsequently, as shown in operation 2101 of FIG. 21, channel-forming preliminary layers 310 and 320 may be formed on a semiconductor substrate 100. The channel-forming preliminary layer 310 may correspond to the first transistor (refer to 200A in FIGS. 4 to 6) having five multi-bridge channels MBCa. The channel-forming preliminary layer 320 may correspond to the second transistor (refer to 200B in FIGS. 4 to 6) having two multi-bridge channels MBCb.

The channel-forming preliminary layer 310 may be formed by sequentially stacking a first sacrificial layer 111a, a first channel layer 112a, a second sacrificial layer 113a, a second channel layer 114a, a third sacrificial layer 115a, a third channel layer 116a, a fourth sacrificial layer 117a, a fourth channel layer 118a, a fifth sacrificial layer 119a and a fifth channel layer 120a.

The channel-forming preliminary layer 320 may be formed by sequentially stacking a first sacrificial layer 121a, a first channel layer 122a, a second sacrificial layer 123a, a second channel layer 124a and a third sacrificial layer 125a. The first sacrificial layers 111a and 121a, the first channel layers 112a and 122a, the second sacrificial layers 113a and 123a, and the second channel layers 114a and 124a of the channel-forming preliminary layers 310 and 320 may be formed during the same process operation. The number of multi-bridge channels may be controlled by varying the numbers of sacrificial layers and channel layers included in the channel-forming preliminary layers 310 and 320.

The channel-forming preliminary layers 310 and 320 may be formed by using an epitaxial growth method or a molecular beam epitaxy method. The sacrificial layers 111a, 113a, 115a, 117a, 119a, 121a, 123a and 125a may respectively include material layers having similar lattice constants as the channel layers 112a, 114a, 116a, 118a, 120a, 122a and 124a, and may respectively have etch selectivities with respect to the channel layers 112a, 114a, 116a, 118a, 120a, 122a and 124a.

For example, when the channel layers 112a, 114a, 116a, 118a, 120a, 122a and 124a are formed by using an epitaxial silicon layer, the sacrificial layers 111a, 113a, 115a, 117a, 119a, 121a, 123a and 125a may be formed by using an epitaxial silicon germanium layer. In this case, the sacrificial layers 111a, 113a, 115a, 117a, 119a, 121a, 123a and 125a, and the channel layers 112a, 114a, 116a, 118a, 120a, 122a and 124a may be continuously formed in-situ.

The sacrificial layers 111a, 113a, 115a, 117a, 119a, 121a, 123a and 125a, and the channel layers 112a, 114a, 116a, 118a, 120a, 122a and 124a included in the channel-forming preliminary layers 310 and 320 may have a thickness of about 10 nm to about 30 nm. The sacrificial layer 125a included in the channel-forming preliminary layer 310 may be formed to have a greater thickness than other sacrificial layers to prevent occurrence of a step difference between the first transistor (refer to 200A in FIGS. 4 to 6) and the second transistor (refer to 200B in FIGS. 4 to 6).

A mask layer 330 may be formed on the channel-forming preliminary layers 310 and 320. The mask layer 330 may include a material having a high etch selectivity with respect to silicon and silicon germanium. The mask layer 330 may include silicon nitride in view of subsequent processes. The mask layer 330 may be formed to a thickness of, for example, about 100 nm or less. The mask layer 330 may be formed by using an ordinary deposition process, for example, a chemical vapor deposition (CVD) process, a low-pressure CVD (LPCVD) process, or a plasma-enhanced CVD (PECVD) process.

Figure 12A:
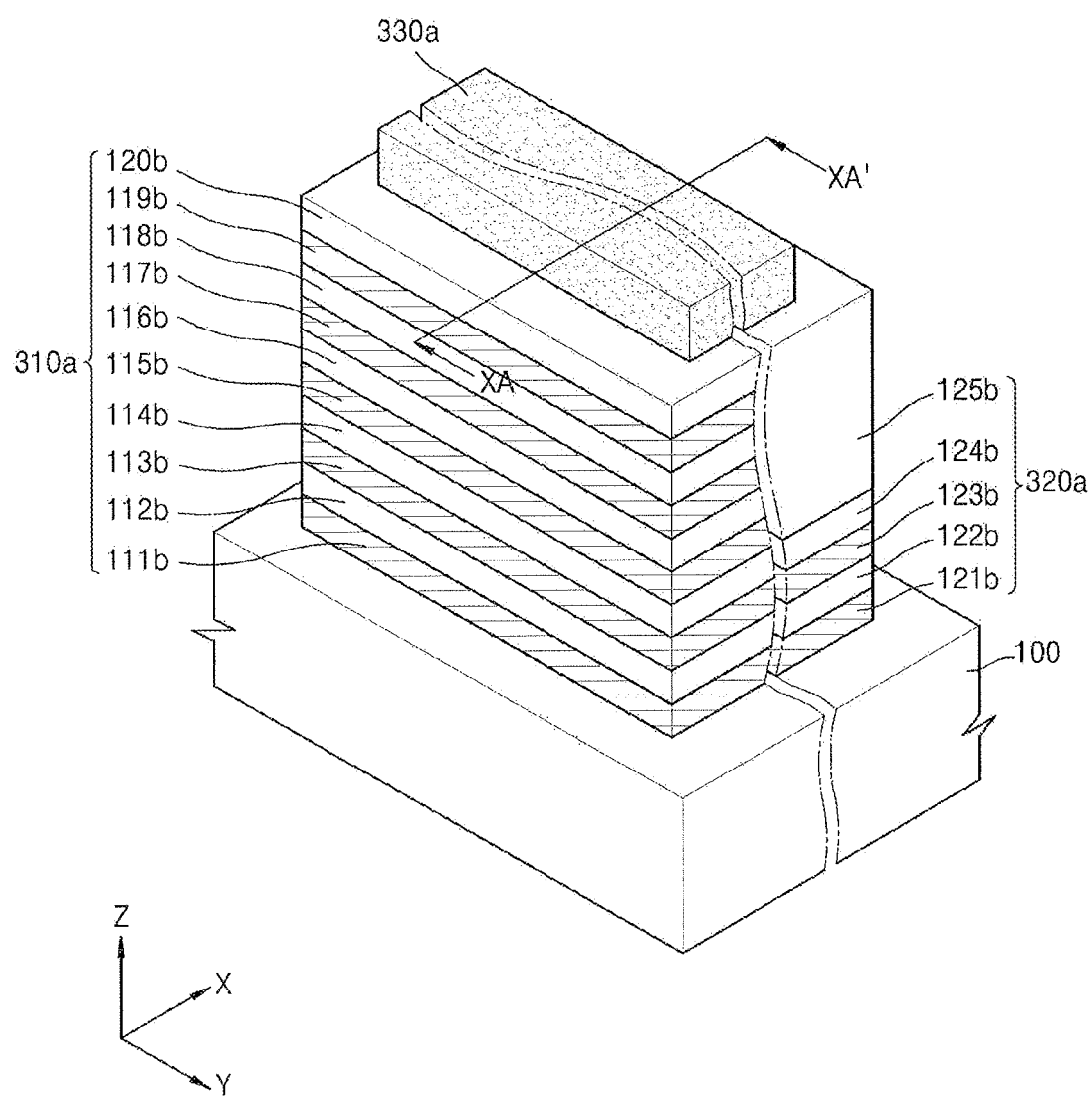
Figure 12B:
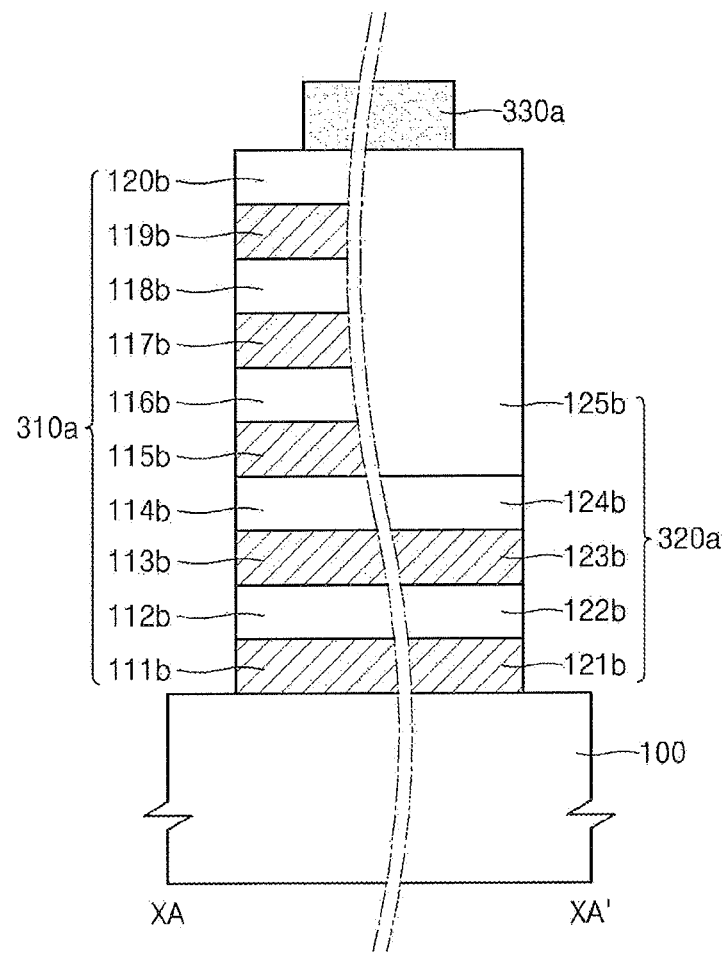

Referring to FIGS. 12A and 12B and operation 2102 of FIG. 21, the channel-forming preliminary layers 310 and 320 and the mask layer 330 may be patterned, thereby forming channel-forming preliminary patterns 310a and 320a and a mask pattern 330a. The channel-forming preliminary patterns 310a and 320a may include patterned sacrificial layers 111b, 113b, 115b, 117b, 119b, 121b, 123b and 125b, and patterned channel layers 112b, 114b, 116b, 118b, 120b, 122b and 124b. The mask pattern 330a may be formed to have a smaller width in the X-direction and a smaller length in the Y-direction than a width in the X-direction and a width in the Y-direction of the channel-forming preliminary patterns 310a and 320a.

The channel-forming preliminary patterns 310a and 320a and the mask pattern 330a may be formed by using the following method. The channel-forming preliminary layers 310 and 320 and the mask layer 330 may be patterned by using a photolithography process according to sizes of the channel-forming preliminary patterns 310a and 320a. Also, the patterned mask layer 330 may be further etched by using an isotropic-etching process to form the mask pattern 330a having a smaller width in the X-direction and a smaller length in the Y-direction than the channel-forming preliminary patterns 310a and 320a.

Figure 13A:
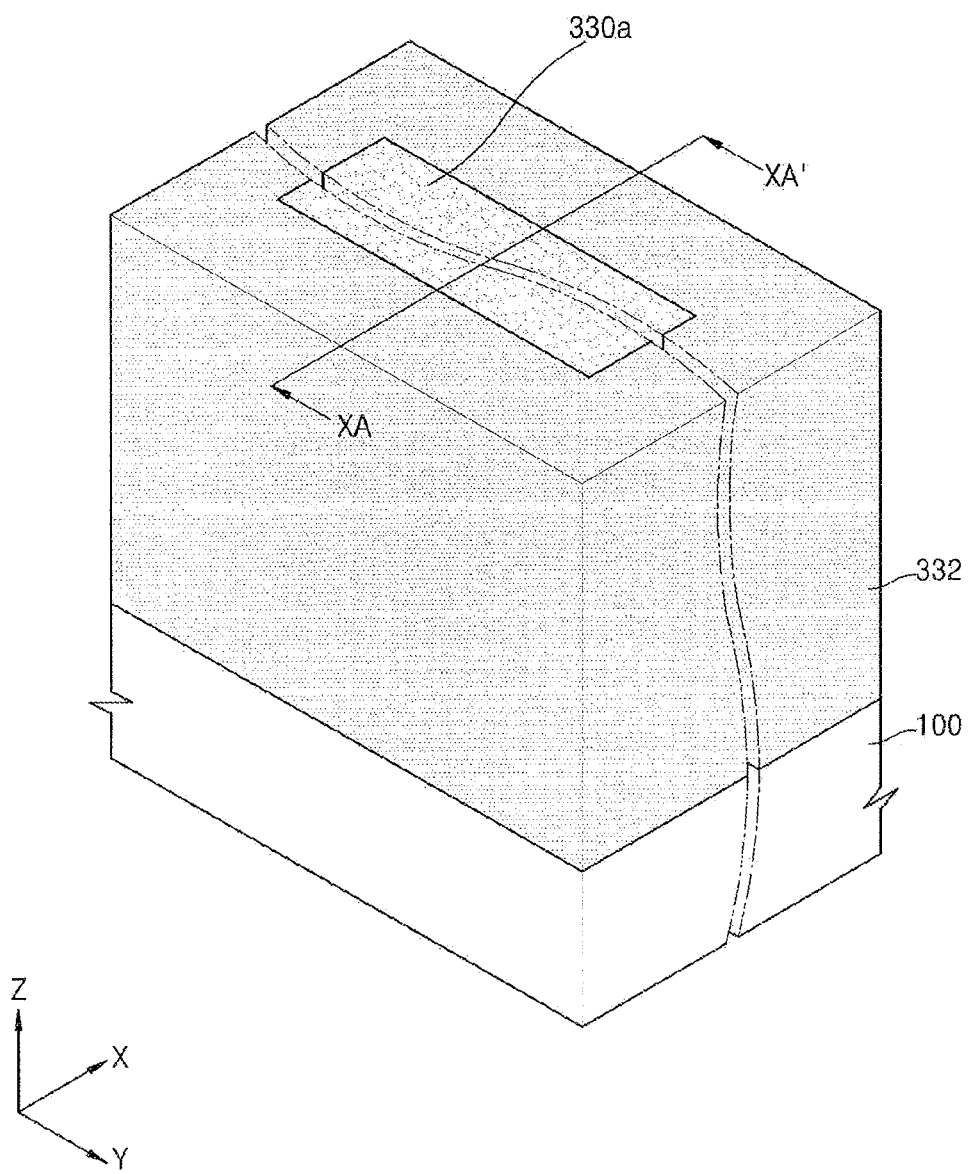
Figure 13B:
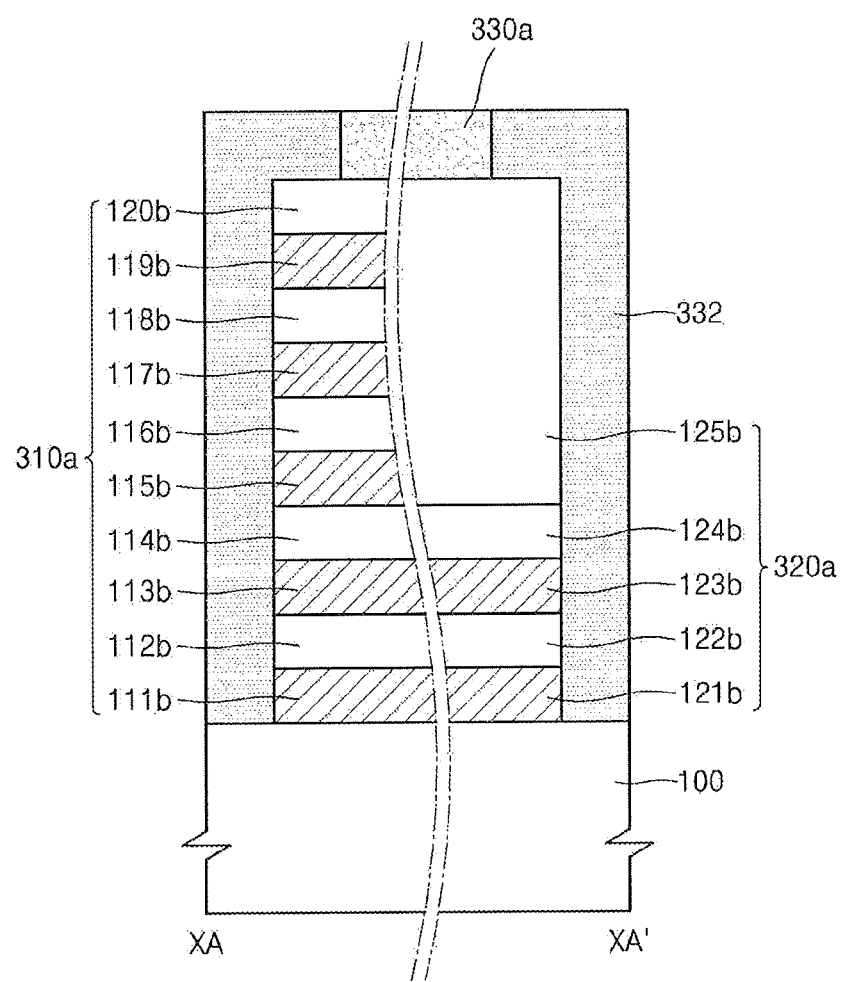

Referring to FIGS. 13A and 13B and operation 2103 of FIG. 21, a molder insulating layer may be deposited to have a thickness that covers the semiconductor substrate 100, the channel-forming preliminary patterns 310a and 320a, and the mask pattern 330a, and planarized until the mask pattern 330a is exposed. As a result, a molder pattern 332 may be formed on the semiconductor substrate 100 and surround the channel-forming preliminary patterns 310a and 320a and the mask pattern 330a.

The molder pattern 332 may include a material having a high etch selectivity with respect to the mask pattern 330a, the sacrificial layers 111b, 113b, 115b, 117b, 119b, 121b, 123b and 125b, and the channel layers 112b, 114b, 116b, 118b, 120b, 122b and 124b. For example, if the mask pattern 330a includes silicon nitride, the molder pattern 332 may include silicon oxide. In this case, the molder pattern 332 may include a silicon oxide layer selected from the group consisting of an undoped silicate glass (USG) layer, a high-density plasma (HDP) oxide layer, a PE-TEOS layer and a combination thereof.

Figure 14A:
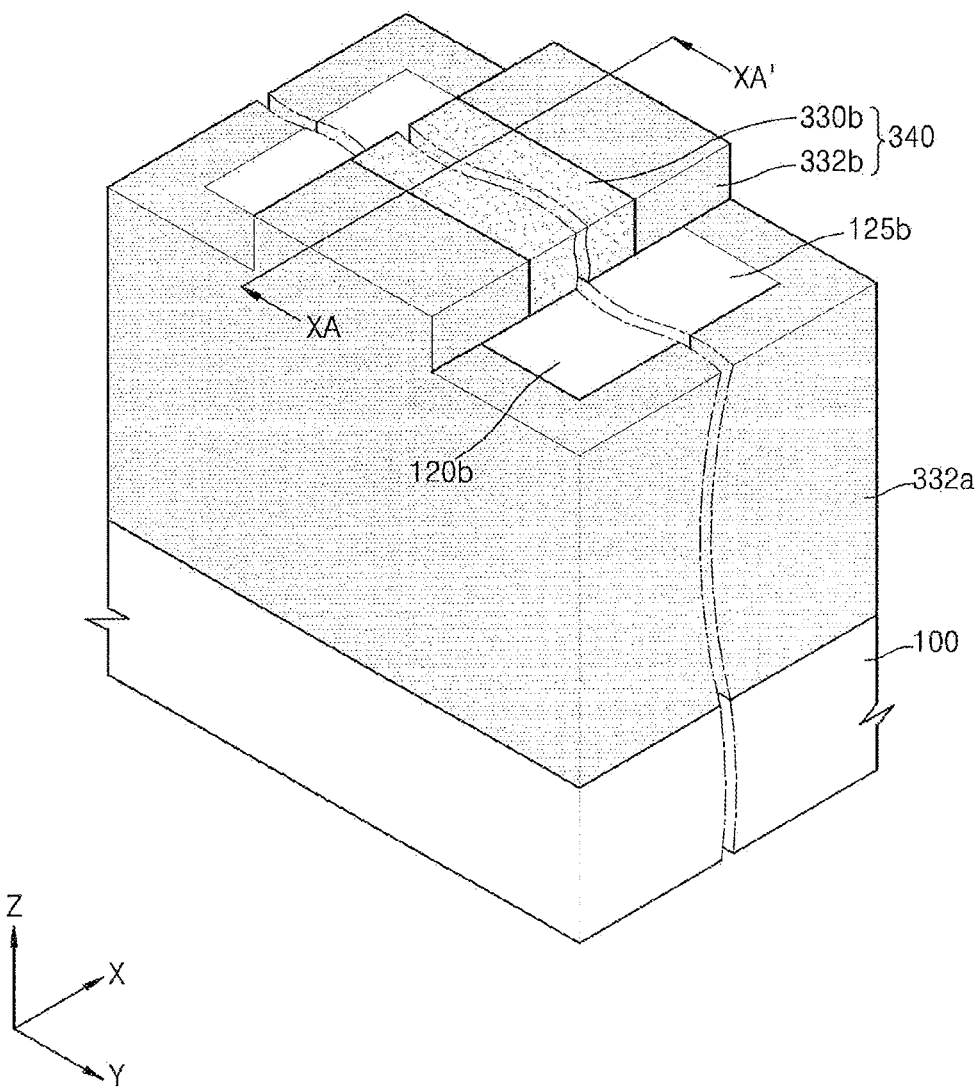
Figure 14B:
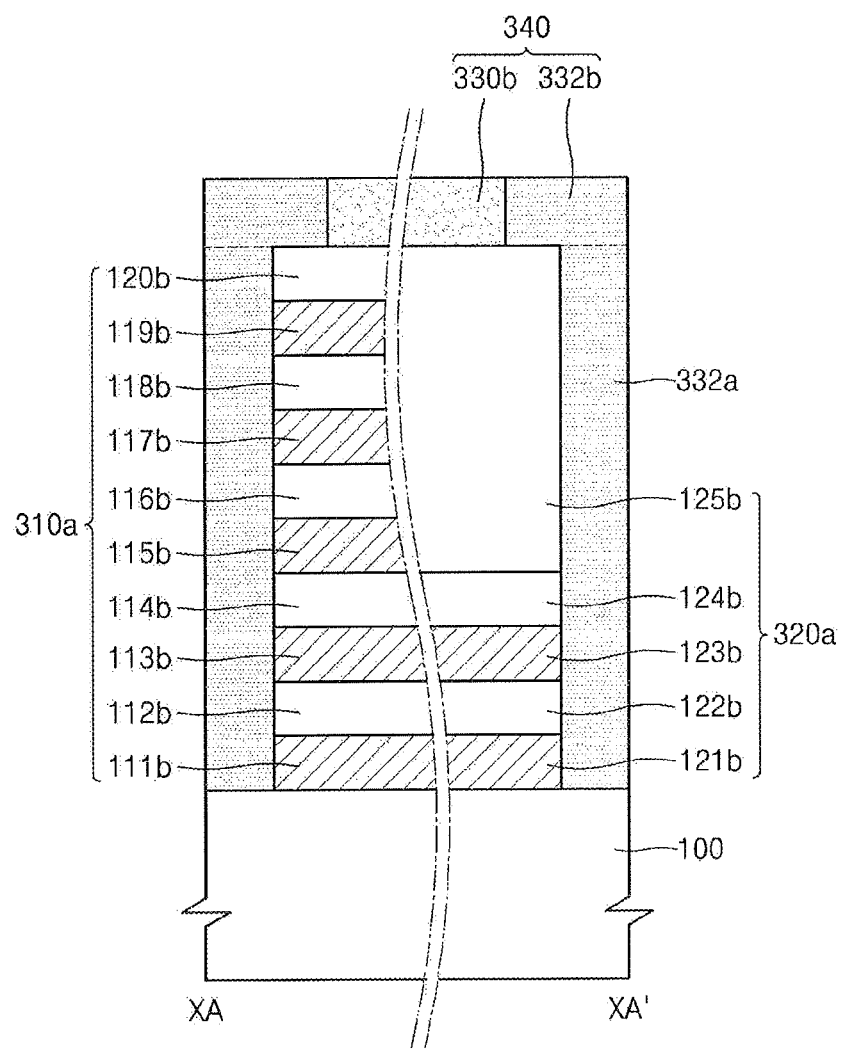

Referring to FIGS. 14A and 14B and operation 2104 of FIG. 21, the molder pattern 332 and the mask pattern 330a may be simultaneously patterned, thereby forming a dummy gate pattern 340 including a portion 332b of the molder pattern 332 and a portion 330b of the mask pattern 330a. A portion 332a of the molder pattern 332 may surround the channel-forming preliminary patterns 310a and 320a. The patterning process may be performed by using a photoresist pattern as an etch mask.

Additionally, the etching of the molder pattern 332 and the mask pattern 330a may be performed until top surfaces of the channel-forming preliminary patterns 310a and 320a are exposed on both sides of the dummy gate pattern 340. The dummy gate pattern 340, which is formed as a result of the etching process, may be a line-type pattern extending in an X direction.

Figure 15A:
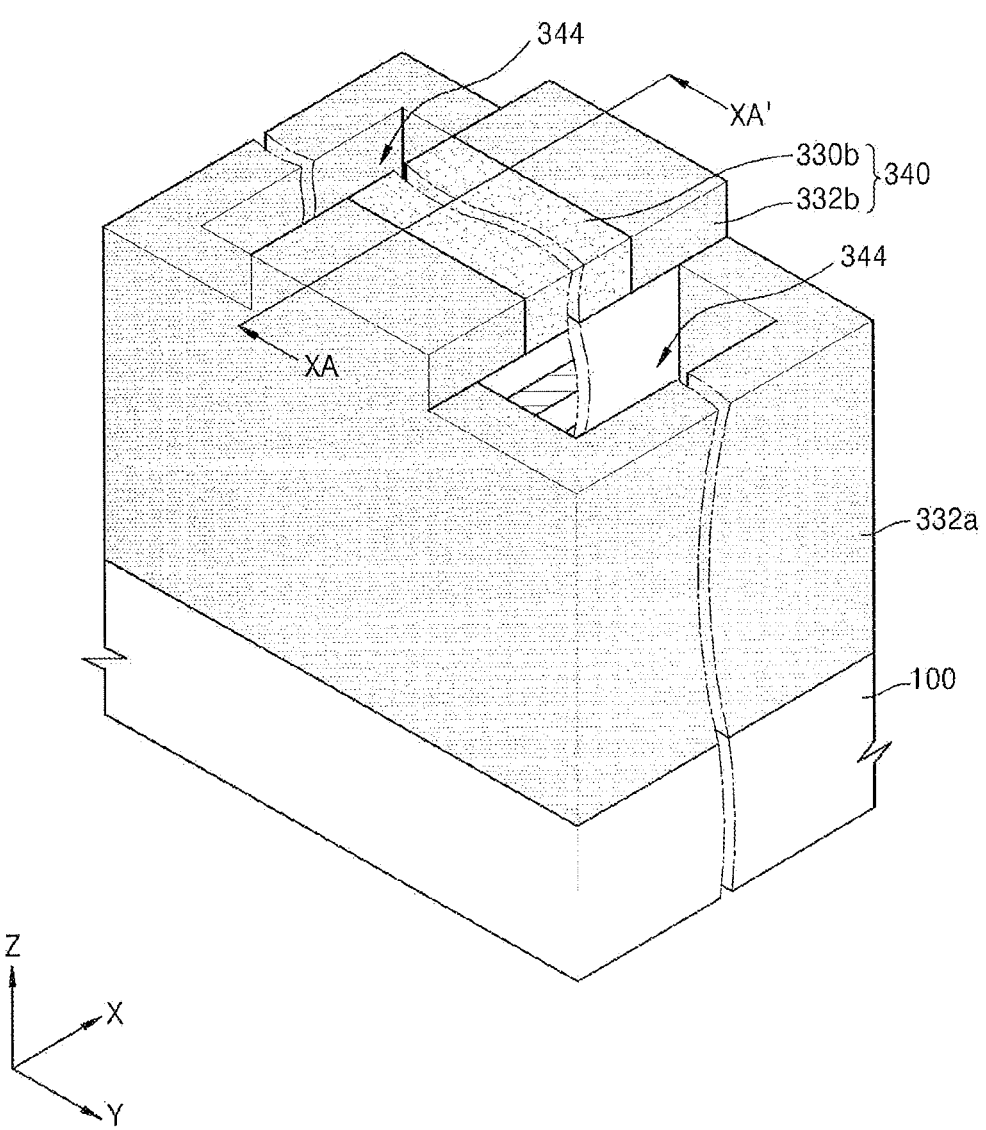
Figure 15B:
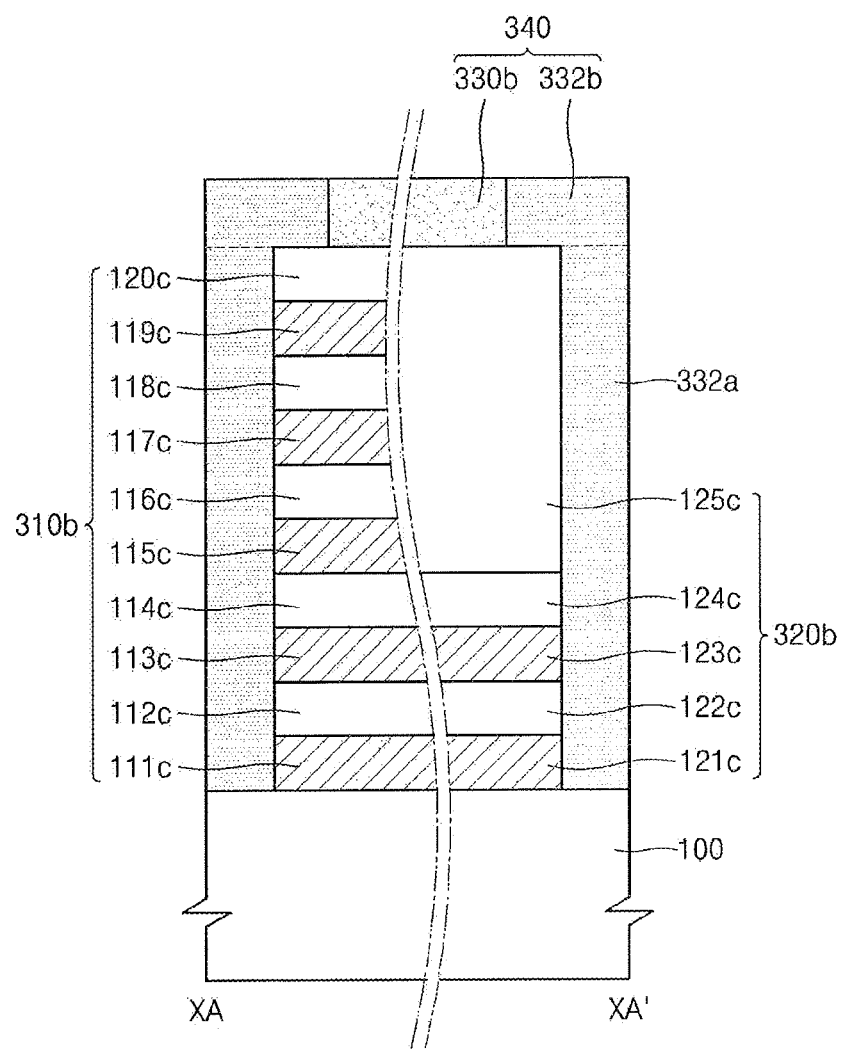

Referring to FIGS. 15A and 15B and operation 2105 of FIG. 21, the channel-forming preliminary patterns 310a and 320a may be anisotropically dry etched by using the dummy gate pattern 340 as an etch mask. In this case, an appropriate etch gas may be selected to use the dummy gate pattern 340 and the remaining molder pattern 332a as an etch mask. For example, the etching of the molder pattern 332 and the mask pattern 330a may be performed by using an etch gas having the same etch selectivity with respect to silicon and silicon germanium and high etch selectivities with respect to a silicon oxide layer and a silicon nitride layer.

In addition, the sacrificial layers 111b, 113b, 115b, 117b, 119b, 121b, 123b and 125b, and the channel layers 112b, 114b, 116b, 118b, 120b, 122b and 124b may be continuously etched in-situ. As the result of the etching process, channel-forming preliminary patterns 310b and 320b may remain only under the dummy gate pattern 340.

A pair of first holes 344 may be formed on both sides of the remaining channel-forming preliminary patterns 310b and 320b and defined by the remaining molder pattern 332a and the remaining channel-forming preliminary patterns 310b and 320b. Portions of the top surface of the semiconductor substrate 100 may be exposed by the pair of first holes 344. Due to the patterning process, the channel-forming preliminary patterns 310b and 320b may include the sacrificial layers 111c, 113c, 115c, 117c, 119c, 121c, 123c and 125c, and the channel layers 112c, 114c, 116c, 118c, 120c, 122c and 124c.

Figure 16A:
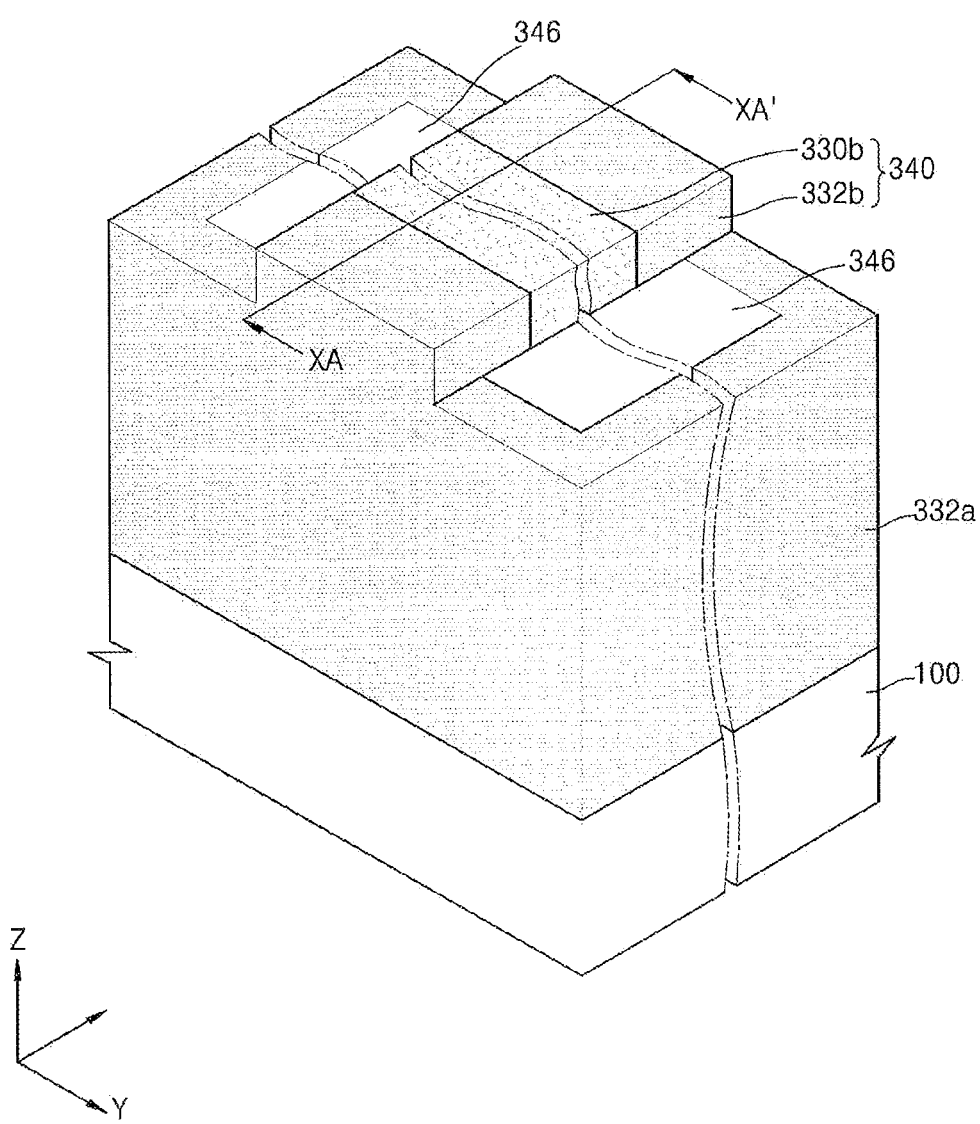
Figure 16B:
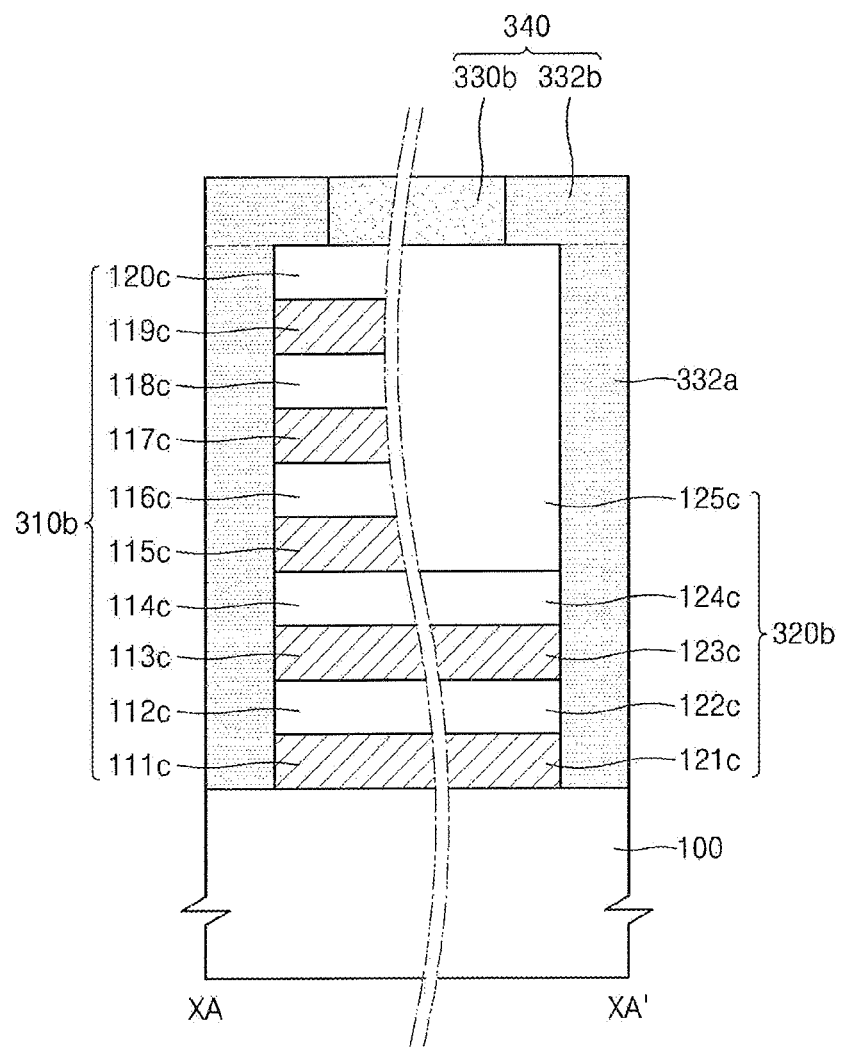

Referring to FIGS. 16A and 16B and operation 2106 of FIG. 21, source and drain patterns 346 may be formed in the first holes 344. The source and drain patterns 346 may include single-crystalline silicon or polysilicon (poly-Si). When the source and drain patterns 346 are formed by using a silicon epitaxial layer (or epi-layer), the first holes 344 may be filled with single-crystalline silicon by using a selective epitaxial growth (SEG) process of selectively forming a silicon epi-layer only on the portions of the top surface of the semiconductor substrate 100 exposed by the pair of first holes 344.

The single crystalline silicon layer or the poly-Si layer deposited to fill the first holes 344 may also be planarized by using an etchback process until a top surface of the portion 332a of the molder pattern 332 is exposed. As a result, the source and drain patterns 346 may have a height that is substantially equal to a level of the top surfaces of the remaining channel-forming preliminary patterns 310a and 320a.

Figure 17A:
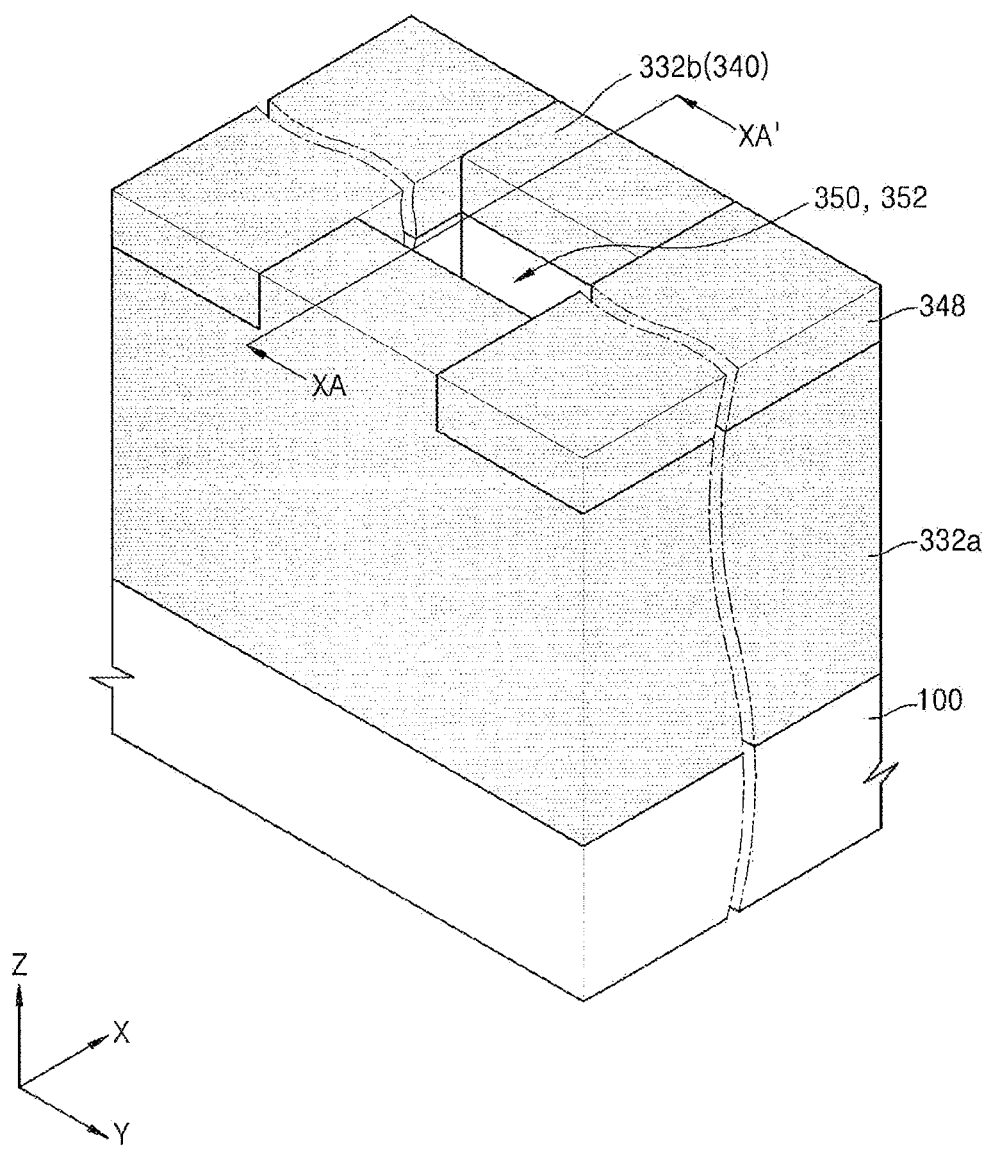
Figure 17B:
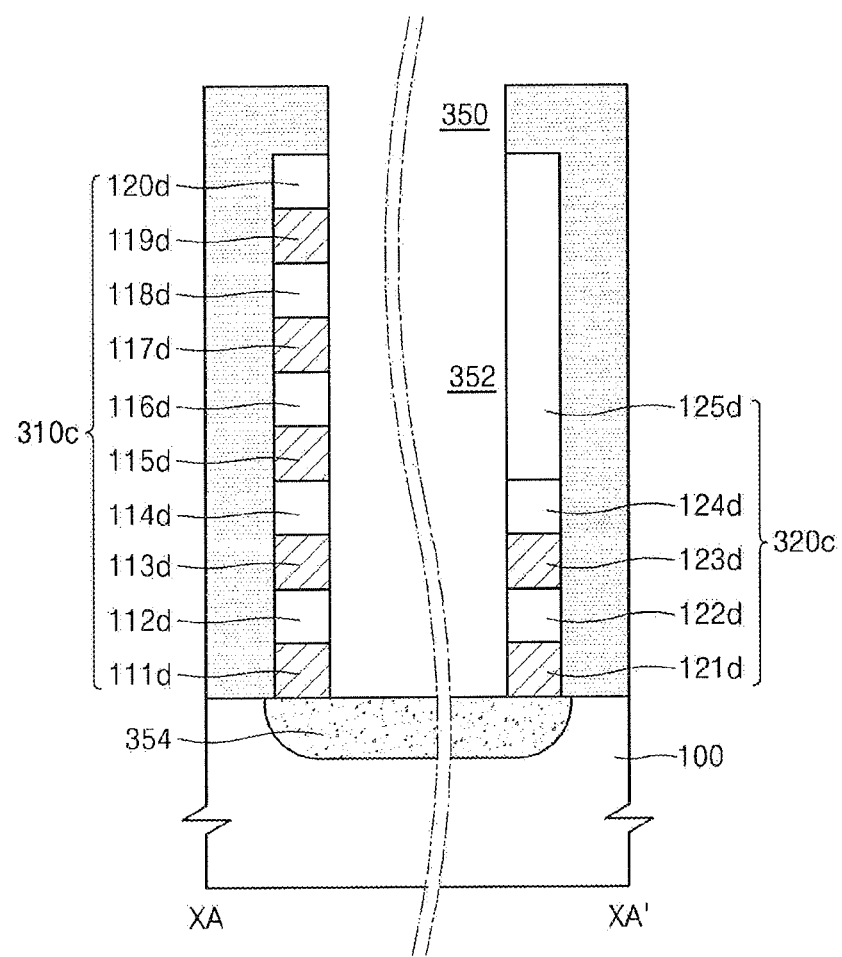

Referring to FIGS. 17A and 17B and operation 2107 of FIG. 21, a buffer insulating layer may be deposited to a thickness on the remaining molder pattern 332a that covers the source and drain patterns 346, and the dummy gate pattern 340, and planarized until the dummy gate pattern 340 is exposed. As a result, a buffer layer pattern 348 may be formed on the remaining molder pattern 332a and source and drain patterns 346. The buffer layer pattern 348 may include the same material as the molder pattern 332a.

Thereafter, as shown in FIG. 17A, only the remaining mask pattern 330b may be removed from the dummy gate pattern 340. As a result, top surfaces of the channel-forming preliminary patterns 310b and 320b, and a buffer layer pattern 348 may be formed in a space occupied by the mask pattern 330b and surrounded with the buffer layer pattern 348 and the portion 332b of the molder pattern 332 that is included in the dummy gate pattern 340.

Subsequently, the remaining channel-forming preliminary patterns 310b and 320b exposed by the groove 350 may be anisotropically etched. In this case, an appropriate etch gas may be selected to use the portion 332b of the molder pattern 332b included in the dummy gate pattern 340 and the buffer layer pattern 348 as an etch mask. For example, the etching process may be performed by using an etch gas having the same etch selectivity with respect to silicon and silicon germanium and a high etch selectivity with respect to silicon oxide.

As a result of the etching process, channel-forming preliminary patterns 310c and 320c may remain only under the portion 332b of the molder pattern 332 included in the dummy gate pattern 340. Due to the etching process, the channel-forming preliminary patterns 310c and 320c may include sacrificial layers 111d, 113d, 115d, 117d, 119d, 121d, 123d and 125d, and channel layers 112d, 114d, 116d, 118d, 120d, 122d and 124d.

A second hole 352 may be formed in a space defined by the remaining channel-forming preliminary patterns 310c and 320c and the source and drain patterns 346 and connected to the groove 350. The top surface of the semiconductor substrate 100 may be exposed by the second hole 352.

Subsequently, as shown in FIG. 17B, a channel formation blocking layer 354 may be formed in the semiconductor substrate 100 as needed. Since the channel formation blocking layer 354 is an arbitrary element, the present process may also be arbitrary. The channel formation blocking layer 354 may be formed by implanting ions into the semiconductor substrate 100 exposed by the groove 350 and the second hole 352. In this case, the portion 332 of the molder pattern 332b of the dummy gate pattern 340 and the buffer layer pattern 348 may be used as a mask.

Since the channel formation blocking layer 354 is used to prevent an operation of a base transistor, ions of the same conductivity type as the semiconductor substrate 100 may be implanted. For example, when the semiconductor substrate 100 is of a p-type, a Group 3B element, such as boron (B) or indium (In), may be implanted.

Figure 18A:
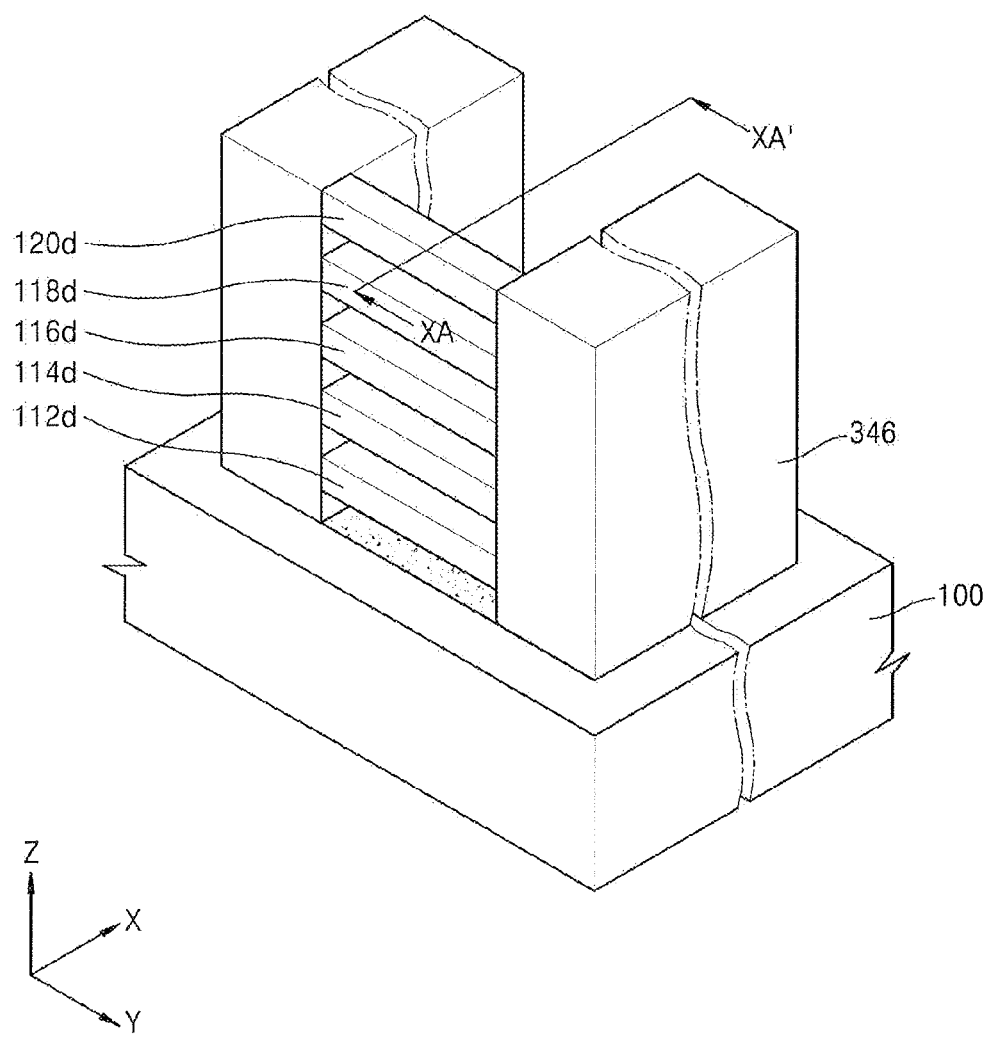
Figure 18B:
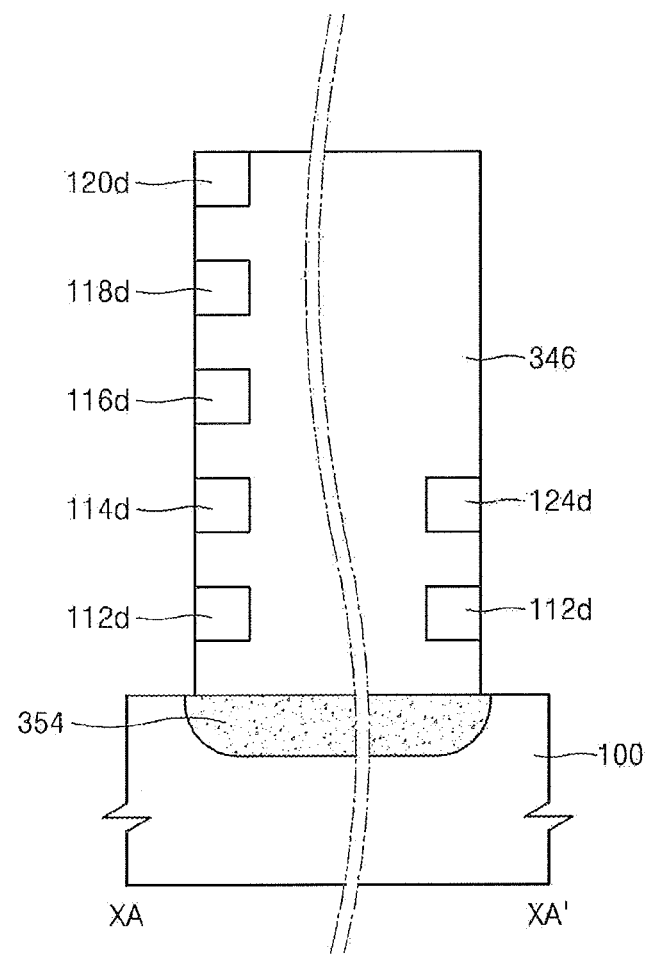

Referring to FIGS. 18A and 18B and operation 2108 of FIG. 2108, to begin with only the buffer layer pattern 348 and the remaining portions 332a and 332b of the molder pattern 332 may be removed by using a selective etching process. The etching process may be performed by using a silicon oxide etch gas or silicon oxide etchant having a high selectivity with respect to silicon and/or silicon germanium.

Thereafter, the sacrificial layer 111d, 113d, 115d, 117d, 119d, 121d, 123d and 125d of the channel-forming preliminary patterns 310c and 320c may be removed. As a result, only the source and drain patterns 346 and the channel layer patterns 112d, 114d, 116d, 118d, 120d, 122d and 124d may remain on the semiconductor substrate 100. The channel layer patterns 112d, 114d, 116d, 118d, 120d, 122d and 124d may be between the source and drain patterns 346 and spaced apart from one another.

The remaining channel layer patterns 112d, 114d, 116d, 118d, 120d, 122d and 124d may remain between the source and drain patterns 346 over the semiconductor substrate 100. The channel layer patterns 112d, 114d, 116d, 118d, 120d, 122d and 124d may have quadrangular sectional shapes. The channel layer patterns 112d, 114d, 116d, 118d, 120d, 122d and 124d may be nano-bridges, which may be included in the multi-bridge channels described above with reference to FIGS. 4 to 10.

Figure 19A:
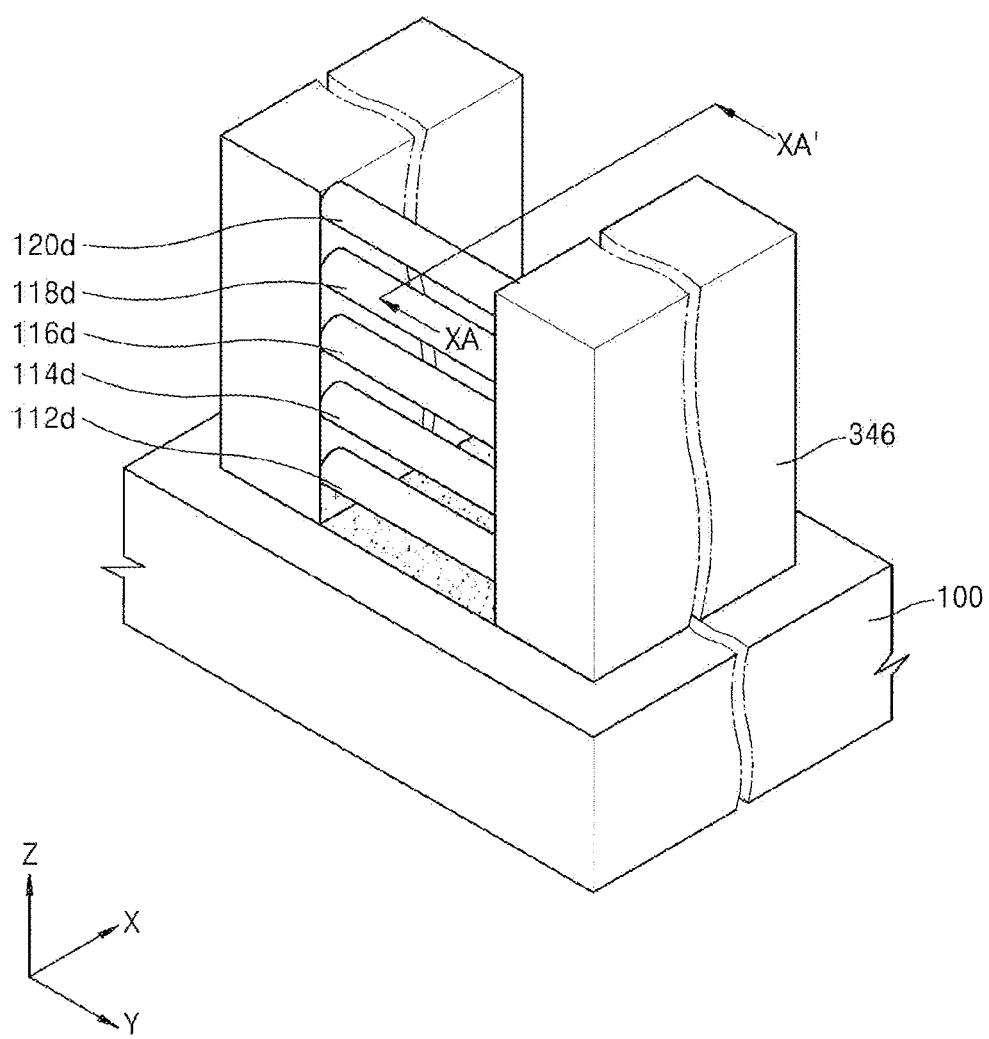
Figure 19B:
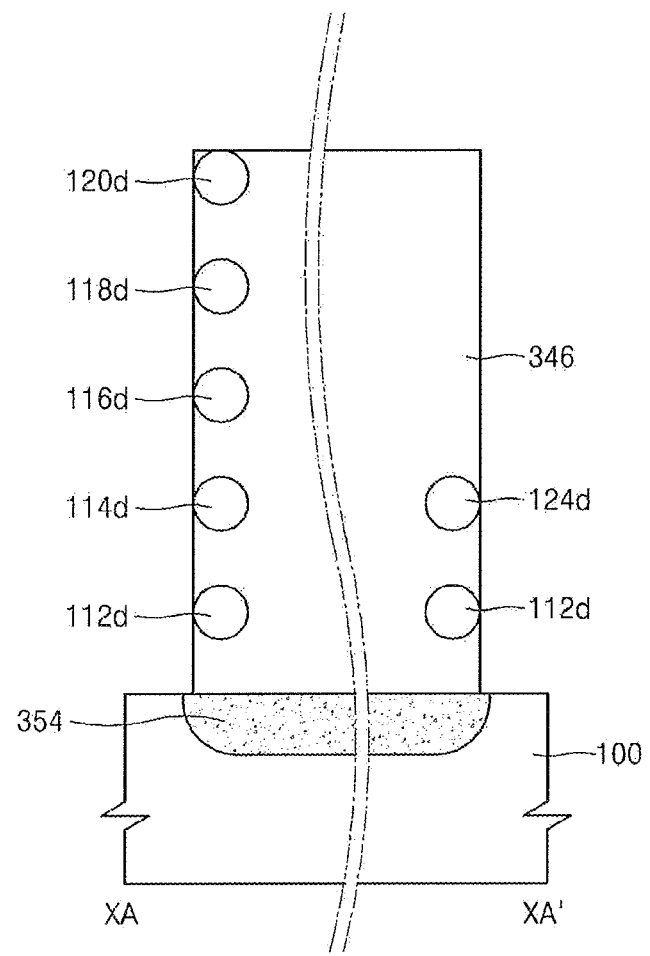

Referring to FIGS. 19A and 19B and operation 2109 of FIG. 21, the semiconductor substrate 100 on which the source and drain patterns 346 and the plurality of channel layer patterns 112d, 114d, 116d, 118d, 120d, 122d and 124d are formed may be annealed by a first annealing process.

The first annealing process may be a process that tends to make the sectional shapes of the channel layer patterns 112d, 114d, 116d, 118d, 120d, 122d and 124d round. In other words, the first annealing process may not be performed when it is not intended to round the sectional shapes of the channel layer patterns 112d, 114d, 116d, 118d, 120d, 122d and 124d. If the channel layer patterns 112d, 114d, 116d, 118d, 120d, 122d and 124d (or nano-bridges) have substantially circular sectional shapes or substantially elliptical circular shapes, more ideal isotropic electric potentials for channels may be formed than if the channel layer patterns 112d, 114d, 116d, 118d, 120d, 122d and 124d (or nano-bridges) have substantially quadrangular sectional shapes.

The first annealing process may be performed at such an appropriate temperature that sectional shapes of the channel layer patterns 112d, 114d, 116d, 118d, 120d, 122d and 124d become round. For example, the first annealing process may be performed in a hydrogen atmosphere at a temperature of about 600.degree. C. to about 1200.degree. C. Alternatively, the first annealing process may be performed in an argon atmosphere at a temperature of about 900.degree. C. to about 1200.degree. C.

Figure 20A:
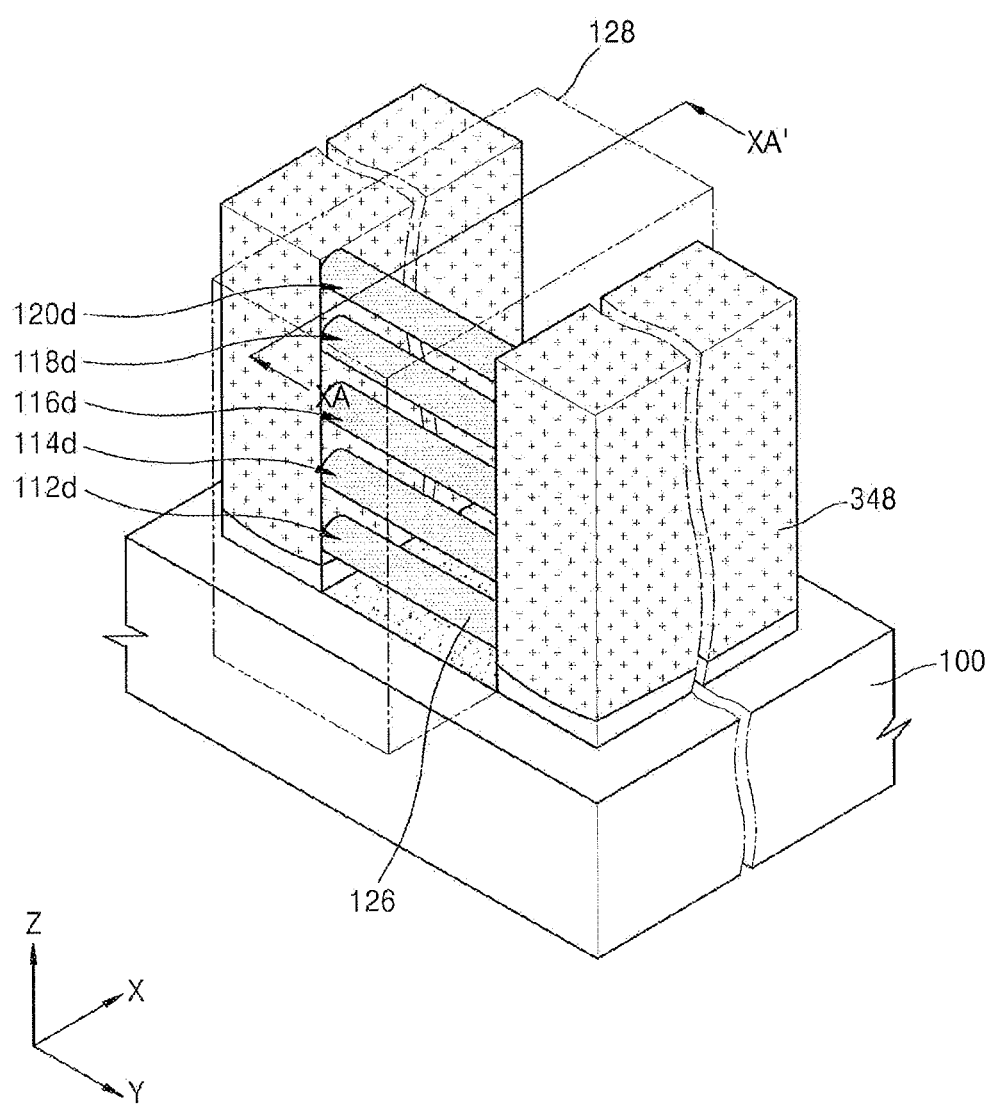
Figure 20B:
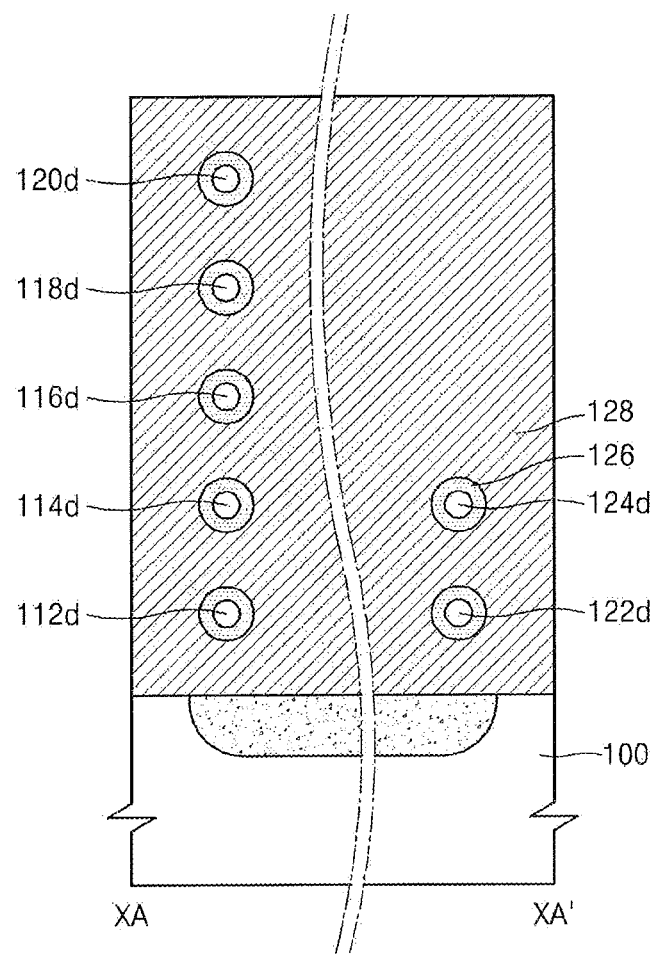
Figure 21:
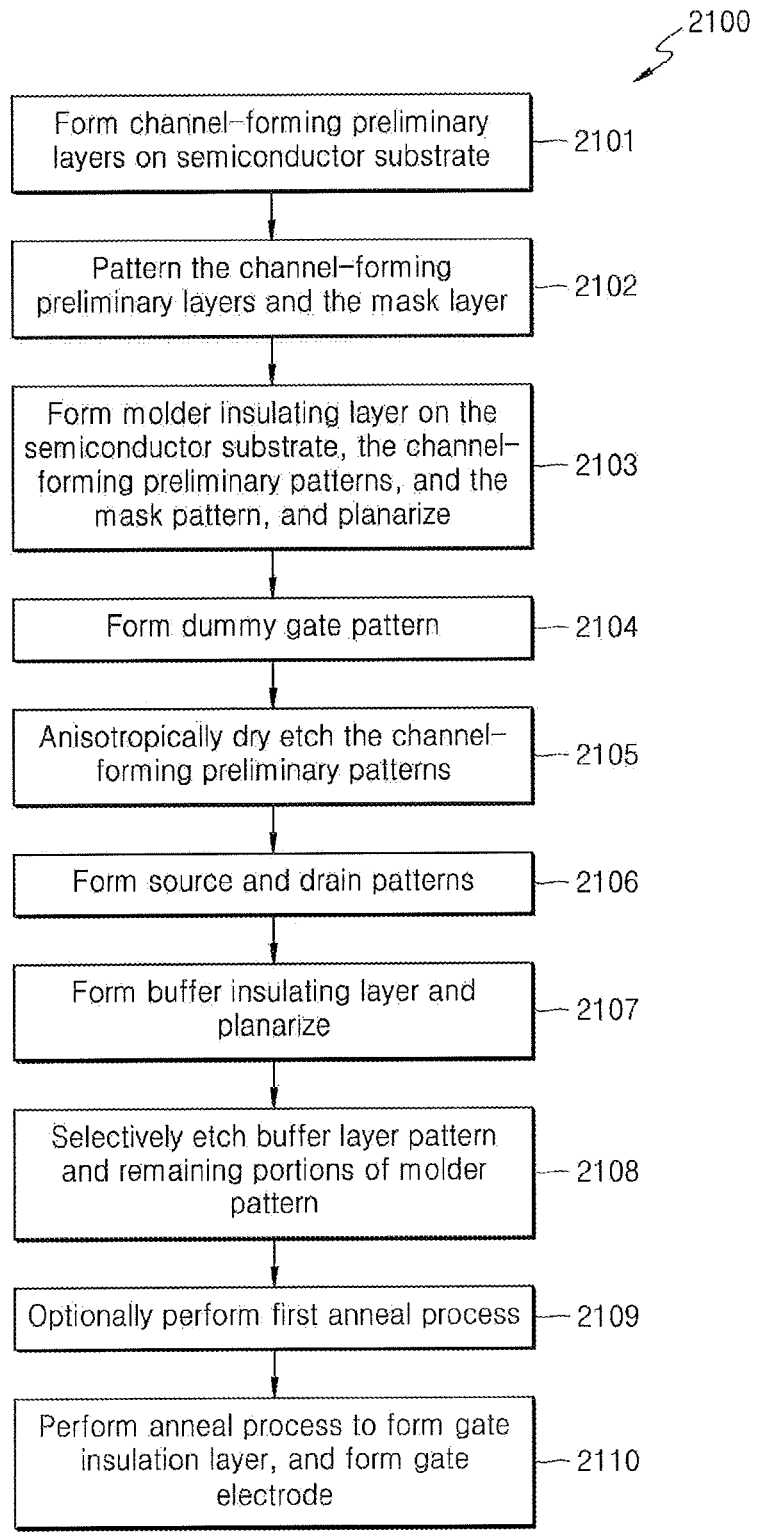
FIG. 21 is a flow diagram of a method of manufacturing transistors according to an embodiment.

Referring to FIGS. 20A and 20B and operation 2110 of FIG. 21, the resultant structure may be annealed a second time in an oxygen atmosphere or an ozone atmosphere to form a gate insulating layer 126. When the resultant structure is annealed in the oxygen or ozone atmosphere, an exposed silicon surface may be consumed so that the gate insulating layer 126 may be formed as a silicon oxide layer on the exposed silicon surface. An annealing temperature and time duration of the second annealing process may vary according to a desired thickness of the gate insulating layer 126.

A gate electrode 128 may be formed between the source and drain patterns 346. The gate electrode 128 may include a single poly-Si layer or a compound layer including a poly-Si layer and a conductive layer having a lower resistivity than the poly-Si layer. Poly-Si may be deposited in vacant spaces between the source and drain patterns 346 in which the channel layer patterns 112d, 114d, 116d, 118d, 120d, 122d and 124d are formed.

The gate electrode 128 may be formed as a line type extending substantially in an X' direction. Subsequently, source and drain regions 348, S, or D may be defined by performing an ion-implantation process on the source and drain patterns 346. Thus, the formation of the transistors 200 or 200-1 may be completed.

Figure 22:
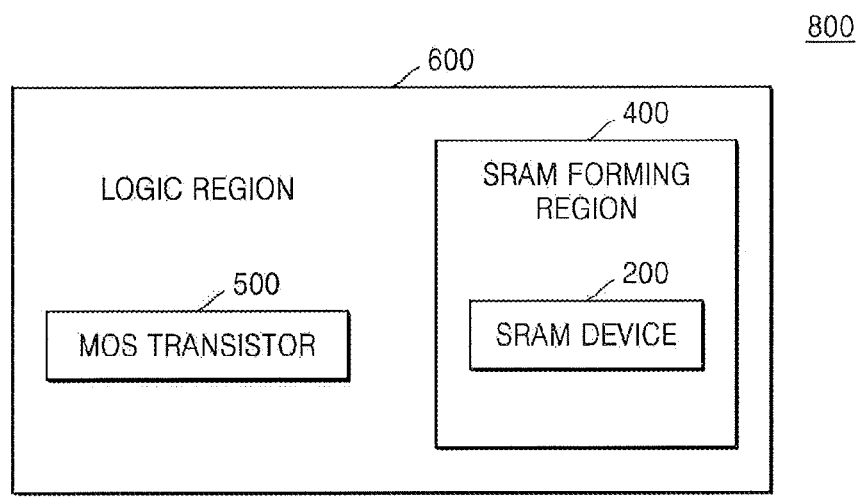
FIG. 22 depicts a schematic diagram of a logic device including an SRAM device according to an embodiment.

FIG. 22 depicts a block diagram of a logic device 800 including one or more SRAM devices 200 according to an embodiment.

Specifically, the logic device 800 may include an SRAM forming region 400 and a logic region 600. The SRAM forming region 400 may include one or more SRAM devices 200 according to an embodiment. A single SRAM device 200 is depicted as an example in FIG. 22 for brevity.

As described above, the SRAM device 200 may include a first inverter including a first load transistor and a first drive transistor, a second inverter including a second load transistor and a second drive transistor, a first transfer transistor connected to an output node of the first inverter, and a second transfer transistor connected to an output node of the second inverter.

In addition, at least one of the first and second load transistors, the first and second drive transistors, and the first and second transfer transistors may include a transistor having a number of multi-bridge channels that is different from the number of multi-bridge channels of the other transistors.

A circuit element configured to process data may be installed in the logic region 600. A circuit element configured to process data of the SRAM device 200 or external data may be installed in the logic region 600. For example, a MOS transistor 500 may be formed in the logic region 600.

Figure 23:
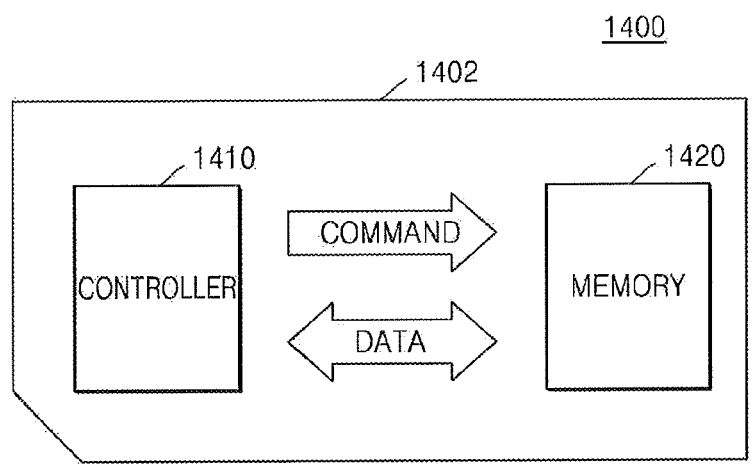
FIG. 23 depicts a schematic diagram of a card including an SRAM device according to an embodiment.

FIG. 23 depicts a block diagram of a card 1400 that includes one or more SRAM devices according to an embodiment.

Specifically, the card 1400 may include a controller 1410 and a memory 1420 located on a circuit board 1402. The controller 1410 and the memory 1420 may be located to exchange electric signals. For example, when the controller 1410 issues a command, the memory 1420 may transmit data in response to the command. The memory 1420 or the controller 1410 may include one or more SRAM devices according to an embodiment.

The card 1400 may be one of various kinds of cards, for example, a memory stick card, a smart media (SM) card, a secure digital (SD) card, a mini SD card, or a multimedia card (MMC).

Figure 24:
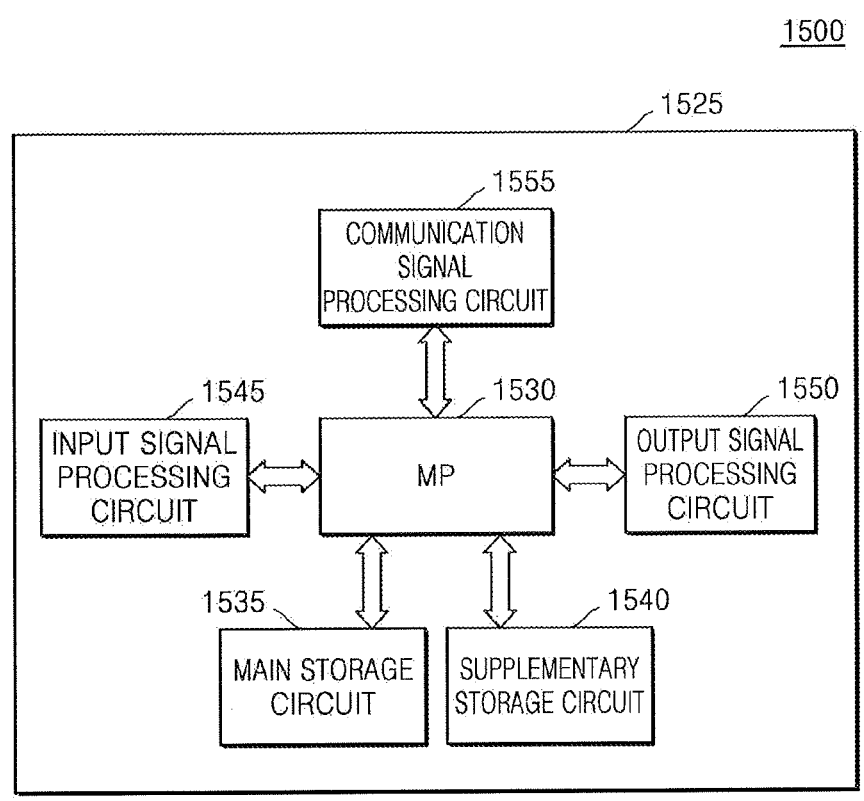
FIG. 24 depicts a schematic block diagram of an electronic circuit board including an SRAM device according to an embodiment.

FIG. 24 depicts a schematic block diagram of an electronic circuit board 1500 including one or more SRAM devices according to an embodiment.

Specifically, the electronic circuit board 1500 may include a microprocessor (MP) 1530 located on a circuit board 1525, a main storage circuit 1535 and a supplementary storage circuit 1540 configured to communicate with the MP 1530, an input signal processing circuit 1545 configured to issue a command to the MP 1530, an output signal processing circuit 1550 configured to receive the command from the input signal processing circuit 1545, and a communication signal processing circuit 1555 configured to transmit and receive electric signals to and from other circuit boards. Arrows depicted in FIG. 23 may be interpreted as paths through which the electric signals are transmitted.

The MP 1530 may receive and process various electric signals, output processing results, and control other elements of the electronic circuit board 1500. The MP 1530 may be interpreted as, for example, a central processing unit (CPU) and/or a main control unit (MCU).

The main storage circuit 1535 may temporarily store data, which is always or frequently required by the MP 1530, or processed data or data to be processed. Since the main storage circuit 1535 requires a high response speed, the main storage circuit 1535 may include a semiconductor memory chip. More specifically, the main storage circuit 1535 may be a semiconductor memory called a cache. The main storage circuit 1535 may include one or more SRAM devices according to an embodiment. Furthermore, the main storage circuit 1535 may include dynamic random access memory (DRAM), resistive RAM (RRAM), applied semiconductor memories thereof (e.g., utilized RAM, ferroelectric RAM (FRAM), fast-cycle RAM, phase-change RAM (PRAM), and magnetic RAM (MRAM)), and/or other semiconductor memories.

Additionally, the main storage circuit 1535 may be independent of volatility and non-volatility and include a random access memory (RAM). The supplementary storage circuit 1540, which is a mass storage device, may be a non-volatile semiconductor memory (e.g., a flash memory), a hard disk drive (HDD) using a magnetic field, or a compact disc drive (CDD) using light. As compared with the main storage circuit 1535, the supplementary storage circuit 1540 may be used when it is intended to store mass data rather than to obtain a high operation speed. The supplementary storage circuit 1240 may be independent of random and non-random and include a non-volatile storage device.

The supplementary storage circuit 1540 may include one or more SRAM devices according to an embodiment. The input signal processing circuit 1545 may convert an external command into an electric signal or transmit an external electric signal to the MP 1530.

The external command or the external electric signal may be an operation command, an electric signal to be processed, or data to be stored. The input signal processing circuit 1545 may be, for example, a terminal signal processing circuit configured to process a signal transmitted from a keyboard, a mouse, a touch pad, an image recognizer, or various sensors, an image signal processing circuit configured to process an image signal input to a scanner or a camera, or one of various sensors or input signal interfaces. The input signal processing circuit 1545 may include one or more SRAM devices according to an embodiment.

The output signal processing circuit 1550 may be an element configured to externally transmit an electric signal processed by the MP 1530. For example, the output signal processing circuit 1550 may be a graphic card, an image processor, an optical converter, a beam panel card, or a multifunctional circuit. The output signal processing circuit 1550 may include one or more SRAM devices according to an embodiment.

The communication signal processing circuit 1555 may be an element configured to directly transmit and receive electric signals to and from other electronic systems or other circuit boards without passing through the input signal processing circuit 1545 or the output signal processing circuit 1550. For instance, the communication circuit 1555 may be a modem of a PC system, a local area network (LAN) card, or one of various interface circuits. The communication circuit 1555 may include one or more SRAM devices according to an embodiment.

Figure 25:
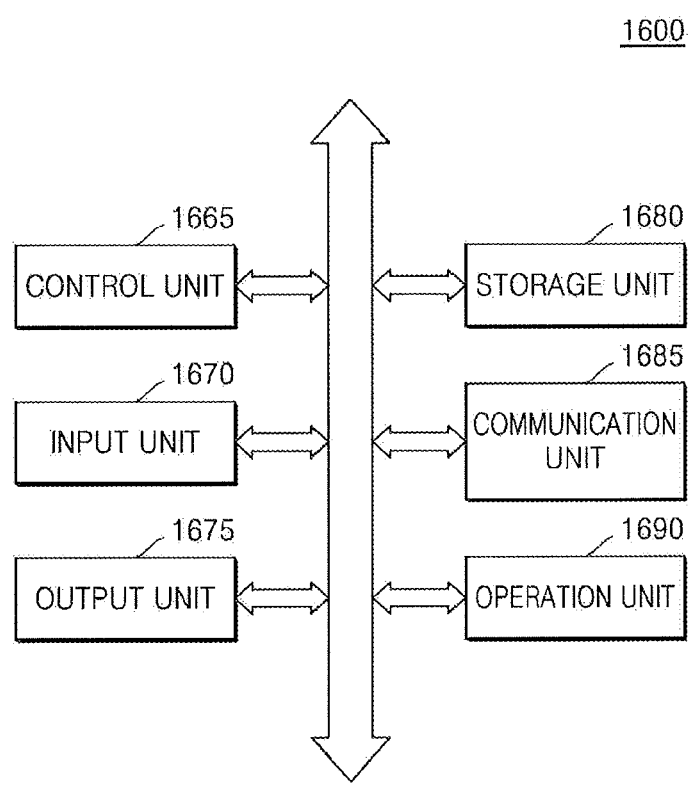
FIG. 25 depicts a schematic block diagram of an electronic system including an SRAM device according to an embodiment.

FIG. 25 depicts a schematic block diagram of an electronic system 1600 including one or more SRAM devices according to an embodiment.

Referring to FIG. 25, the electronic system 1600 may include a control unit 1665, an input unit 1670, an output unit 1675, and a storage unit 1680 and further include a communication unit 1685 and/or an additional operation unit 1690.

The control unit 1665 may generally control the electronic system 1600 and respective portions. The control unit 1665 may be interpreted as a central processing unit (CPU) or a central control unit (CCU) and include the electronic circuit board (refer to 1500 in FIG. 23) according to an embodiment. Also, the control unit 1665 may include an SRAM device according to an embodiment.

The input unit 1670 may transmit an electric command signal to the control unit 1665. The input unit 1670 may be a keyboard, a keypad, a mouse, a touch pad, an image recognizer (e.g., a scanner), or one of various input sensors. The input unit 1670 may include one or more SRAM devices according to an embodiment.

The output unit 1675 may receive the electric command signal from the control unit 1665 and output a processing result of the electronic system 1600. The output unit 1675 may be a monitor, a printer, a beam irradiator, or one of various mechanical devices. The output unit 1675 may include one or more SRAM devices according to an embodiment.

The storage unit 1680 may be an element configured to temporarily or permanently store an electric signal to be processed by the control unit 1665 or an electric signal already processed by the control unit 1665. The storage unit 1680 may be physically or electrically connected or coupled to the control unit 1665. The storage unit 1680 may be a semiconductor memory, a magnetic storage device (e.g., a hard disk), an optical storage device (e.g., a compact disc), or another server having a data storage function. Also, the storage unit 1680 may include one or more SRAM devices according to an embodiment.

The communication unit 1685 may receive an electric command signal from the control unit 1665 and transmit or receive an electric signal to or from another electronic system. The communication unit 1685 may be a wired transceiver (e.g., a modem and a LAN card), a wireless transceiver (e.g., a WiBro interface), or an infrared (IR) port. Also, the communication unit 1685 may include one or more SRAM devices according to an embodiment.

The additional operation unit 1690 may perform a physical operation or a mechanical operation in response to a command of the control unit 1665. For example, the operation unit 1690 may be an element (e.g., a plotter, an indicator, or an up/down operator) capable of a mechanical operation. The electronic system 1600 according to an embodiment may be a computer, a network server, a networking printer or scanner, a wireless controller, a mobile communication terminal, an exchanger or one of other electronic devices capable of programmed operations.

In addition, the electronic system 1600 may be used for a mobile phone, a MP3 player, navigation system, a portable multimedia player (PMP), a solid-state disk (SSD) or a household appliance.

Figure 26:
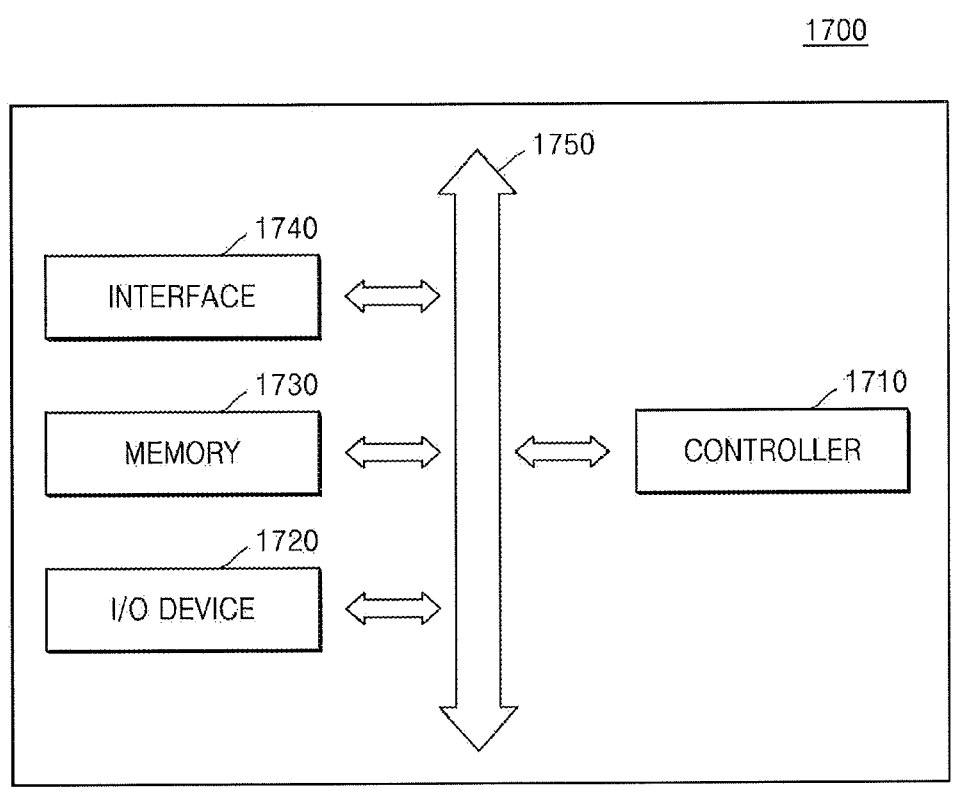
FIG. 26 depicts a schematic diagram of an electronic system including an SRAM device according to an embodiment.

FIG. 26 is a schematic diagram of an electronic system 1700 including an SRAM device according to an embodiment.

Specifically, the electronic system 1700 may include a controller 1710, an input/output (I/O) device 1720, a memory 1730, and an interface 1740. The electronic system 1700 may be a mobile system or a system configured to transmit or receive information. The mobile system may be a personal digital assistant (PDA), a portable computer, a web tablet, a wireless phone, a mobile phone, a digital music player, or a memory card.

The controller 1710 may execute a program and control the electronic system 1700. The controller 1710 may include an SRAM device according to an embodiment. The controller 1710 may be, for example, an MP, a digital signal processor (DSP), a microprocessor (MC), or a device similar thereto.

The I/O device 1720 may be used to input or output data to and from the electronic system 1700. The electronic system 1700 may be connected to an external apparatus (e.g., a personal computer (PC) or a network) by using the I/O device 1720 and exchange data with the external apparatus. The I/O device 1720 may be, for example, a keypad, a keyboard, or a display device.

The memory 1730 may store codes and/or data for operating the controller 1710 and/or data processed by the controller 1710. The memory 1730 may include an SRAM device according to an embodiment. The interface 1740 may be data transmission path between the electronic system 1700 and another external apparatus. The controller 1710, the I/O device 1720, the memory 1730, and the interface 1740 may communicate with one another via a bus 1750.

For example, the electronic system 1700 may be used for a mobile phone, a MP3 player, a navigation apparatus, a portable multimedia player (PMP), a solid-state disk (SSD), or a household appliance.

Figure 27:
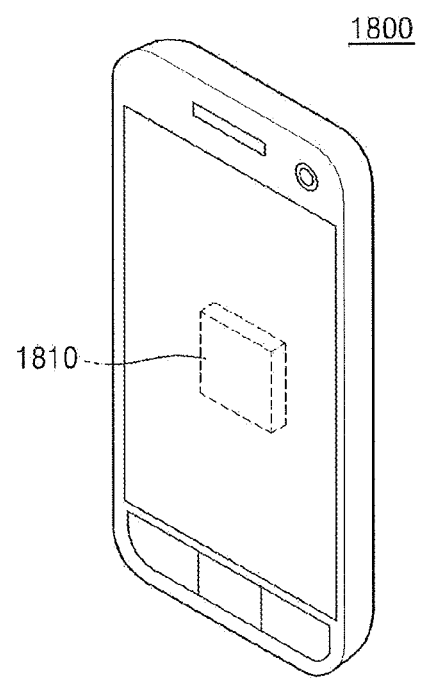
FIG. 27 depicts a schematic perspective view of an electronic device including an SRAM device according to an embodiment.

FIG. 27 depicts a schematic perspective view of an electronic device including one or more SRAM devices according to an embodiment.

Specifically, FIG. 27 depicts a specific example of applying the electronic system 1700 of FIG. 26 to a mobile phone 1800. The mobile phone 1800 may include a system-on chip (SoC). The SoC 1810 may include one or more SRAM devices according to an embodiment. Since the mobile phone 1800 includes the SoC 1810 in which a relatively highly efficient main function block may be disposed, the mobile phone 1800 may have relatively high performance. Also, since the SoC 1810 has relatively high performance on the same area, the mobile phone 1800 may have a minimized size and relatively high performance.

While this inventive concept has been particularly shown and described with reference to embodiments thereof, it will be understood by those skilled in the art that various changes in form and details may be made therein without departing from the spirit and scope of the inventive concept as defined by the appended claims. The embodiments should be considered in descriptive sense only and not for purposes of limitation. Therefore, the scope of the inventive concept is defined not by the detailed description of the inventive concept, but by the appended claims, and all differences within the scope will be construed as being included in the inventive concept.

What is claimed is:

1. A semiconductor device, comprising:
a first p-type metal oxide semiconductor (PMOS) transistor and a first n-type metal oxide semiconductor (NMOS) transistor; and
a second NMOS transistor connected to an output node of the first PMOS transistor and first NMOS transistor,
wherein the first PMOS transistor includes a plurality of first nano-wires, a first source region and a first drain region on both sides of each of the plurality of first nano-wires, and a first gate that completely surrounds each of the plurality of first nano-wires,
the first NMOS transistor includes a plurality of second nano-wires, a second source region and a second drain region on both sides of each of the plurality of second nano-wires, and a second gate extending from the first gate, the second gate completely surrounding each of the plurality of second nano-wires,
the second NMOS transistor includes a plurality of third nano-wires, a third source region and a third drain region on both sides of each of the plurality of third nano-wires, and a third gate separated from the first and the second gates, the third gate completely surrounding each of the plurality of third nano-wires,
a number of the plurality of third nano-wires is greater than a number of the plurality of first nano-wires, and
the first gate and the second gate share respective first nano-wires and second nano-wires.

2. The semiconductor device of claim 1, wherein:
the first PMOS transistor is a load transistor,
the first NMOS transistor is a drive transistor, and
the second NMOS transistor is a transfer transistor.

3. The semiconductor device of claim 1, wherein a number of the plurality of second nano-wires is greater than the number of the plurality of first nano-wires.

4. The semiconductor device of claim 1, wherein a number of the plurality of second nano-wires is greater than the number of the plurality of third nano-wires.

5. The semiconductor device of claim 1, further comprising:
a second PMOS transistor and a third NMOS transistor; and
a fourth NMOS transistor connected to an output node of the second PMOS transistor and the third NMOS transistor.

6. The semiconductor device of claim 1, wherein:
the first gate, the second gate and the third gate are arranged in a first direction on a substrate, and
the first nano-wires, the second nano-wires and the third nano-wires are arranged in a second direction that is perpendicular to the first direction on the substrate.

7. A semiconductor device, comprising:
a first p-type metal oxide semiconductor (PMOS) transistor and a first n-type metal oxide semiconductor (NMOS) transistor;
a second NMOS transistor connected to an output node of the first PMOS transistor and first NMOS transistor,
a second PMOS transistor and a third NMOS transistor; and
a fourth NMOS transistor connected to an output node of the second PMOS transistor and the third NMOS transistor,
wherein the first PMOS transistor includes a plurality of first nano-wires, a first source region and a first drain region on both sides of each of the plurality of first nano-wires, and a first gate that completely surrounds each the plurality of first nanowire,
the first NMOS transistor includes a plurality of second nano-wires, a second source region and a second drain region on both sides of the plurality of second nano-wires, and a second gate extended from the first gate, the second gate completely surrounding each of the plurality of second nano-wires,
the second NMOS transistor includes a plurality of third nano-wires, a third source region and a third drain region on both sides of the third nano-wires, and a third gate separated from the first and the second gates, the third gate completely surrounding each of the plurality of third nano-wires,
a number of the plurality of third nano-wires is greater than a number of plurality of first nano-wires, and
the first gate and the second gate share respective first and second nano-wires,
wherein the second PMOS transistor includes a plurality of fourth nano-wires, a fourth source region and a fourth drain region on both sides of each of the plurality of fourth nano-wires, and a fourth gate that completely surrounds each of the plurality of fourth nano-wires,
the third NMOS transistor includes a plurality of fifth nano-wires, a fifth source region and a fifth drain region on both sides of each of the plurality of fifth nano-wires, and a fifth gate extended from the fourth gate, the fifth gate completely surrounding each of the plurality of fifth nano-wires,
the fourth NMOS transistor includes a plurality of sixth nano-wires, a sixth source region and a sixth drain region on both sides of each of the plurality of sixth nano-wires, and a sixth gate separated from the fourth and the fifth gates, the sixth gate completely surrounding each of the plurality of sixth nano-wires,
a number of the plurality of sixth nano-wires is greater than a number of the plurality of fourth nano-wires, and
the fourth gate and the fifth gate share respective fourth and fifth nano-wires.

8. The semiconductor device of claim 7, wherein:
the first PMOS transistor and the second PMOS transistor are a first load transistor and a second load transistor, respectively, the first NMOS and the third NMOS transistor are a first drive transistor and a first drive transistor, respectively, and the second NMOS transistor and the fourth NMOS transistor are a first transfer transistor and a second transfer transistor, respectively.

9. The semiconductor device of claim 7, wherein a number of the plurality of second nano-wires and a number of the plurality of fifth nano-wires are greater than the number of the plurality of first nano-wires and the number of the plurality of fourth nano-wires, respectively.

10. The semiconductor device of claim 7, wherein a number of the plurality of second nano-wires and a number of the plurality of fifth nano-wires are greater than the number of the plurality of third nano-wires and the number of the plurality of sixth nano-wires, respectively.

11. The semiconductor device of claim 7, wherein the first gate, the second gate and the third gate are arranged in a first direction on a substrate, and the first nano-wires, the second nano-wires and the third nano-wires are arranged in a second direction that is perpendicular to the first direction on the substrate.

12. The semiconductor device of claim 7, wherein the fourth gate, the fifth gate and the sixth gate are arranged in a first direction on a substrate, and the fourth nano-wires, the fifth nano-wires and the sixth nano-wires are arranged in a second direction that is perpendicular to the first direction on the substrate.

13. A semiconductor device, comprising:
a first load transistor and a first drive transistor; and
a first transfer transistor connected to an output node of the first load transistor and the first drive transistor
wherein the first load transistor includes a plurality of first nano-wires, a first gate, and a first source region and a first drain region on both sides of the first gate and the first nano-wires,
the first drive transistor includes a plurality of second nano-wires, a second gate extended from the first gate, and a second source region and a second drain region on both sides of the second gate and the second nano-wires,
the first transfer transistor includes a plurality of third nano-wires, a third gate separated from the first and the second gates, and a third source region and a third drain region on both sides of the third gate and the third nano-wires,
a number of the plurality of third nano-wires is greater a number of the plurality of first nano-wires,
the first load transistor is a p-type metal oxide semiconductor (PMOS) transistor,
each of the first drive transistor and the first transfer transistor is an n-type metal oxide semiconductor (NMOS) transistor, the first gate and the second gate are arranged in a first direction on a substrate, and the first nano-wires are arranged in a second direction that is perpendicular to the first direction and between the first source region and the first drain region on the substrate, and the second nano-wires are arranged in the second direction and between the second source region and the second drain region on the substrate, the third gate is arranged in the first direction on the substrate, and the third nano-wires are arranged in the second direction and between the third source region and the third drain region on the substrate, and the first gate and the second gate share respective first and second nano-wires.

14. The semiconductor device of claim 13, wherein a number of the plurality of second nano-wires is greater than a number of the plurality of first nano-wires.

15. The semiconductor device of claim 13, wherein a number of the plurality of second nano-wires is greater than a number of the plurality of third nano-wires.

16. The semiconductor device of claim 13, further comprising:
a second load transistor and a second drive transistor; and
a second transfer transistor connected to an output node of the second load transistor and the second drive transistor.

17. The semiconductor device of claim 16, wherein:
the second load transistor includes a plurality of fourth nano-wires,
the second drive transistor includes a plurality of fifth nano-wires,
the second transfer transistor includes a plurality of sixth nano-wires, and
a number of the plurality of sixth nano-wires is greater than a number of the plurality of fourth nano-wires.

18. The semiconductor device of claim 16, wherein the second load transistor is a p-type metal oxide semiconductor (PMOS) transistor, each of the second drive transistor and the second transfer transistor is an n-type metal oxide semiconductor (NMOS) transistor.

19. The semiconductor device of claim 13, wherein
each of the plurality of first, second, and third nano-wires includes a plurality of nano-wires that are stacked on a semiconductor substrate and spaced apart from one another, and
each of the plurality of nano-wires has a circular sectional shape or an elliptical sectional shape.

20. The semiconductor device of claim 13, wherein the first, second and third source and drain regions have a same height from the substrate.

* * * * *